(12) United States Patent
Zhang et al.

(10) Patent No.: US 11,853,690 B1
(45) Date of Patent: Dec. 26, 2023

(54) SYSTEMS AND METHODS FOR HIGHLIGHTING GRAPHICAL MODELS

(71) Applicant: The MathWorks, Inc., Natick, MA (US)

(72) Inventors: Fu Zhang, Sherborn, MA (US); Yu Jiang, Wellesley, MA (US); Murali K. Yeddanapudi, Lexington, MA (US)

(73) Assignee: The MathWorks, Inc., Natick, MA (US)

( * ) Notice: Subject to any disclaimer, the term of this patent is extended or adjusted under 35 U.S.C. 154(b) by 361 days.

(21) Appl. No.: 15/420,544

(22) Filed: Jan. 31, 2017

Related U.S. Application Data

(60) Provisional application No. 62/343,383, filed on May 31, 2016.

(51) Int. Cl.
*G06F 40/00* (2020.01)
*G06F 40/169* (2020.01)
*G06F 30/20* (2020.01)

(52) U.S. Cl.
CPC ............ *G06F 40/169* (2020.01); *G06F 30/20* (2020.01)

(58) Field of Classification Search
CPC .. G06F 17/241; G06F 17/5009; G06F 40/169; G06F 30/20
USPC .......................................................... 715/233
See application file for complete search history.

(56) References Cited

U.S. PATENT DOCUMENTS

| | | | |
|---|---|---|---|
| 4,755,809 A | 7/1988 | Ikegami et al. | |
| 4,819,189 A | 4/1989 | Kikuchi et al. | |
| 4,901,221 A | 2/1990 | Kodosky et al. | |
| 4,970,664 A * | 11/1990 | Kaiser | G06F 17/5031 715/792 |
| 5,168,441 A | 12/1992 | Onarheim et al. | |
| 5,204,947 A | 4/1993 | Bernstein et al. | |
| 5,241,645 A | 8/1993 | Cimral et al. | |
| 5,299,307 A | 3/1994 | Young | |
| 5,436,637 A | 7/1995 | Gayraud et al. | |

(Continued)

FOREIGN PATENT DOCUMENTS

| | | |
|---|---|---|
| EP | 1709529 A1 | 10/2006 |
| JP | 2000-57183 A1 | 2/2000 |

(Continued)

OTHER PUBLICATIONS

Mathworks, "Display Signal Sources and Destinations", Mar. 20, 2016, 3 pages.*

(Continued)

*Primary Examiner* — Cesar B Paula
*Assistant Examiner* — David Faber
(74) *Attorney, Agent, or Firm* — Cesari and McKenna, LLP

(57) ABSTRACT

Systems and methods may highlight paths through graphical models having executable semantics. Paths through a model leading from a starting location and terminating at final source and/or destination model elements may be identified. The paths may be highlighted. A model may include hierarchical levels, and the highlighting may be extended into lower or higher hierarchical levels relative to a current level. A model may execute over a plurality of simulation time steps, and the highlighting may indicate model elements executing in a given simulation time step.

28 Claims, 23 Drawing Sheets

(56) References Cited

U.S. PATENT DOCUMENTS

| | | | |
|---|---|---|---|
| 5,481,740 A * | 1/1996 | Kodosky | G06F 3/0481 |
| | | | 715/839 |
| 5,559,945 A | 9/1996 | Beaudet et al. | |
| 5,583,977 A | 12/1996 | Seidl | |
| 5,644,740 A | 7/1997 | Kiuchi | |
| 5,651,107 A | 7/1997 | Frank et al. | |
| 5,652,909 A * | 7/1997 | Kodosky | G06F 3/0481 |
| | | | 717/125 |
| 5,671,381 A | 9/1997 | Strasnick et al. | |
| 5,689,711 A | 11/1997 | Bardasz et al. | |
| 5,737,555 A | 4/1998 | Gregg et al. | |
| 5,745,100 A | 4/1998 | Bates et al. | |
| 5,801,958 A | 9/1998 | Dangelo et al. | |
| 5,805,167 A | 9/1998 | van Cruvninqen | |
| 5,844,557 A | 12/1998 | Shively, II | |
| 5,852,449 A * | 12/1998 | Esslinger | G06F 11/323 |
| | | | 345/473 |
| 5,854,630 A | 12/1998 | Nielsen | |
| 5,913,063 A | 6/1999 | McGurrin et al. | |
| 5,926,180 A | 7/1999 | Shimamura | |
| 6,002,398 A | 12/1999 | Wilson | |
| 6,057,844 A | 5/2000 | Strauss | |
| 6,112,201 A | 8/2000 | Wical | |
| 6,167,396 A | 12/2000 | Lokken et al. | |
| 6,173,438 B1 * | 1/2001 | Kodosky | G06F 8/34 |
| | | | 717/105 |
| 6,256,028 B1 | 7/2001 | Sanford et al. | |
| 6,285,374 B1 | 9/2001 | Falcon | |
| 6,336,123 B2 | 1/2002 | Inoue et al. | |
| 6,348,935 B1 | 2/2002 | Malacinski et al. | |
| 6,356,256 B1 | 3/2002 | Leftwich | |
| 6,381,611 B1 | 4/2002 | Hoberqe et al. | |
| 6,396,488 B1 | 5/2002 | Simmons et al. | |
| 6,460,059 B1 | 10/2002 | Wisniewski | |
| 6,512,529 B1 | 1/2003 | Janssen et al. | |
| 6,515,656 B1 | 2/2003 | Wittenburg et al. | |
| 6,580,416 B1 | 6/2003 | Gardner | |
| 6,621,532 B1 | 9/2003 | Mandt | |
| 6,657,644 B1 | 12/2003 | Plow et al. | |
| 6,684,255 B1 | 1/2004 | Martin | |
| 6,704,029 B1 | 3/2004 | Ikeda et al. | |
| 6,754,885 B1 | 6/2004 | Dardinski et al. | |
| 6,771,287 B1 | 8/2004 | Walker et al. | |
| 6,792,475 B1 | 9/2004 | Arcuri et al. | |
| 6,816,175 B1 | 11/2004 | Hamp et al. | |
| 6,961,731 B2 | 11/2005 | Holbrook | |
| 6,983,227 B1 | 1/2006 | Thalhammer-Reyero | |
| 6,986,120 B2 | 1/2006 | Reddy et al. | |
| 7,010,744 B1 | 3/2006 | Torgerson | |
| 7,024,631 B1 | 4/2006 | Hudson et al. | |
| 7,047,496 B2 * | 5/2006 | Nelles | H04L 41/12 |
| | | | 715/734 |
| 7,076,453 B2 | 7/2006 | Jammes et al. | |
| 7,099,809 B2 | 8/2006 | Dori | |
| 7,162,488 B2 | 1/2007 | DeVorchik et al. | |
| 7,242,413 B2 | 7/2007 | Chu et al. | |
| 7,337,102 B2 | 2/2008 | Mosterman | |
| 7,337,409 B2 | 2/2008 | Doblmayr et al. | |
| 7,363,593 B1 | 4/2008 | Loyens et al. | |
| 7,464,373 B1 * | 12/2008 | Yunt | G06F 8/10 |
| | | | 717/125 |
| 7,555,731 B2 | 6/2009 | Torgerson | |
| 7,765,529 B1 * | 7/2010 | Singh | G06F 8/34 |
| | | | 717/134 |
| 7,769,570 B2 | 8/2010 | Mosterman | |
| 7,904,876 B1 * | 3/2011 | Critz | G05B 19/409 |
| | | | 700/17 |
| 8,019,579 B1 * | 9/2011 | Wey | G06F 9/451 |
| | | | 703/6 |
| 8,131,528 B1 * | 3/2012 | Vora | G06F 17/5009 |
| | | | 703/19 |
| 8,522,196 B1 * | 8/2013 | Kim | G06F 11/3664 |
| | | | 717/100 |
| 8,560,958 B1 * | 10/2013 | Feng | G06F 17/5009 |
| | | | 715/734 |
| 8,862,446 B1 * | 10/2014 | Balasubramanian | |
| | | | G06F 17/509 |
| | | | 703/13 |
| 9,547,423 B1 * | 1/2017 | Moore | G06F 9/546 |
| 9,678,725 B1 * | 6/2017 | Brezinsky | H04L 65/1006 |
| 2001/0028369 A1 | 10/2001 | Gallo et al. | |
| 2001/0030667 A1 | 10/2001 | Kelts | |
| 2001/0032248 A1 | 10/2001 | Krafchin | |
| 2001/0045965 A1 | 11/2001 | Orbanes et al. | |
| 2002/0029231 A1 | 3/2002 | Aptus et al. | |
| 2002/0059054 A1 | 5/2002 | Bade et al. | |
| 2002/0083188 A1 | 6/2002 | Hericy et al. | |
| 2002/0152137 A1 | 10/2002 | Lindquist et al. | |
| 2002/0161777 A1 | 10/2002 | Smialek | |
| 2002/0178007 A1 | 11/2002 | Slotznick et al. | |
| 2003/0046663 A1 * | 3/2003 | Rogers | G06F 8/34 |
| | | | 717/125 |
| 2003/0067481 A1 | 4/2003 | Chedgey et al. | |
| 2003/0227483 A1 * | 12/2003 | Schultz | G09G 5/00 |
| | | | 715/763 |
| 2004/0015548 A1 | 1/2004 | Lee | |
| 2004/0017404 A1 * | 1/2004 | Schileru-Key | G06F 3/04815 |
| | | | 715/854 |
| 2004/0158812 A1 * | 8/2004 | Dye | G06F 8/34 |
| | | | 717/105 |
| 2004/0205726 A1 | 10/2004 | Chedgey et al. | |
| 2004/0210831 A1 * | 10/2004 | Feng | G06F 30/20 |
| | | | 715/205 |
| 2005/0066771 A1 | 3/2005 | Marcaria | |
| 2005/0160397 A1 * | 7/2005 | Szpak | G06F 9/542 |
| | | | 717/104 |
| 2005/0268173 A1 * | 12/2005 | Kudukoli | G06F 11/3604 |
| | | | 714/38.1 |
| 2005/0278162 A1 * | 12/2005 | Ciolfi | G06F 17/5009 |
| | | | 703/22 |
| 2006/0129371 A1 * | 6/2006 | Orofino | G06F 8/34 |
| | | | 703/22 |
| 2006/0184982 A1 | 8/2006 | Paz et al. | |
| 2007/0006103 A1 * | 1/2007 | Zhang | G06F 30/30 |
| | | | 716/112 |
| 2007/0118827 A1 * | 5/2007 | Rahman | G06F 17/5045 |
| | | | 716/102 |
| 2007/0157162 A1 * | 7/2007 | Ciolfi | G06F 17/5009 |
| | | | 717/105 |
| 2007/0261019 A1 * | 11/2007 | Raghavan | G06F 9/449 |
| | | | 717/105 |
| 2007/0271499 A1 * | 11/2007 | Feng | G06F 30/20 |
| | | | 715/209 |
| 2008/0034300 A1 * | 2/2008 | Shah | G05B 19/0426 |
| | | | 715/763 |
| 2008/0034310 A1 * | 2/2008 | Kodosky | G05B 19/0426 |
| | | | 715/769 |
| 2008/0040703 A1 * | 2/2008 | Englehart | G06F 8/10 |
| | | | 717/104 |
| 2008/0077382 A1 * | 3/2008 | Strehl | G06F 17/5022 |
| | | | 703/20 |
| 2008/0092111 A1 * | 4/2008 | Kinnucan | G06F 8/10 |
| | | | 717/105 |
| 2008/0098349 A1 * | 4/2008 | Lin | G06F 8/10 |
| | | | 717/106 |
| 2008/0229253 A1 | 9/2008 | Carteri et al. | |
| 2009/0254801 A1 | 10/2009 | Pressman et al. | |
| 2010/0057417 A1 * | 3/2010 | Hudson, III | G06F 8/34 |
| | | | 703/7 |
| 2010/0058289 A1 * | 3/2010 | Hudson, III | G06F 8/34 |
| | | | 717/105 |
| 2010/0077377 A1 * | 3/2010 | Pegden | G06F 8/10 |
| | | | 717/105 |
| 2010/0175045 A1 * | 7/2010 | Ciolfi | G06F 8/34 |
| | | | 717/105 |
| 2010/0325571 A1 * | 12/2010 | Kodosky | G05B 19/0426 |
| | | | 715/772 |
| 2011/0078652 A1 * | 3/2011 | Mani | G06F 8/10 |
| | | | 717/105 |

(56) References Cited

U.S. PATENT DOCUMENTS

| | | | |
|---|---|---|---|
| 2011/0078662 A1* | 3/2011 | Hudson, III | G06F 11/362 |
| | | | 717/125 |
| 2011/0296435 A1* | 12/2011 | Simsek | G06F 8/34 |
| | | | 719/313 |
| 2013/0326472 A1 | 12/2013 | Han et al. | |
| 2014/0013309 A1* | 1/2014 | Gounares | G06F 11/3664 |
| | | | 717/125 |
| 2015/0081598 A1* | 3/2015 | Depizzol | G06F 11/3664 |
| | | | 706/12 |
| 2015/0142401 A1* | 5/2015 | Krenzer | G06F 17/50 |
| | | | 703/6 |
| 2015/0294038 A1* | 10/2015 | Arbel | G06F 17/5022 |
| | | | 703/14 |
| 2015/0302120 A1* | 10/2015 | Hamid | G01R 31/3177 |
| | | | 703/22 |
| 2016/0019071 A1 | 1/2016 | Webb et al. | |
| 2016/0062736 A1* | 3/2016 | Stanfill | G06F 8/10 |
| | | | 717/105 |
| 2016/0078648 A1* | 3/2016 | Gagnon | G06F 8/34 |
| | | | 345/619 |

FOREIGN PATENT DOCUMENTS

| | | |
|---|---|---|
| JP | 4963232 B2 | 6/2012 |
| WO | WO-1999/27443 A1 | 6/1999 |
| WO | WO-2005/066771 A1 | 7/2005 |

OTHER PUBLICATIONS

"LabVIEW: Execution Highlighting," LabVIEW 2015 Help, National Instruments Corporation, Jun. 2015, one page.

Simulink®: User's Guide, R2016a, The MathWorks, Inc., Mar. 2016, pp. 1-3840.

Grossman, Tovi, et al, "Interaction Techniques for 3D Modeling on Large Displays", Proceedings of the 2001 Symposium on Interactive 3D Graphics, Mar. 2001, pp. 17-23.

Rational Rose® RealTime, "Toolset Guide," Rational Software Corporation, May 20, 2002, pp. 1-492.

"Rational Rose: RoundTrip Engineering with Rational Rose/C++", Rational Software Corporation, published: 1996, pp. 1-236.

* cited by examiner

SYSTEMS AND METHODS FOR HIGHLIGHTING GRAPHICAL MODELS

CROSS-REFERENCE TO RELATED APPLICATIONS

This application claims the benefit of Provisional Patent Application Ser. No. 62/343,383, filed May 31, 2016, for Systems and Methods for Highlighting Graphical Models, which application is hereby incorporated by reference in its entirety.

BRIEF DESCRIPTION OF THE DRAWINGS

The description below refers to the accompanying drawings, of which.

DETAILED DESCRIPTION OF ILLUSTRATIVE EMBODIMENTS

Figure 1:
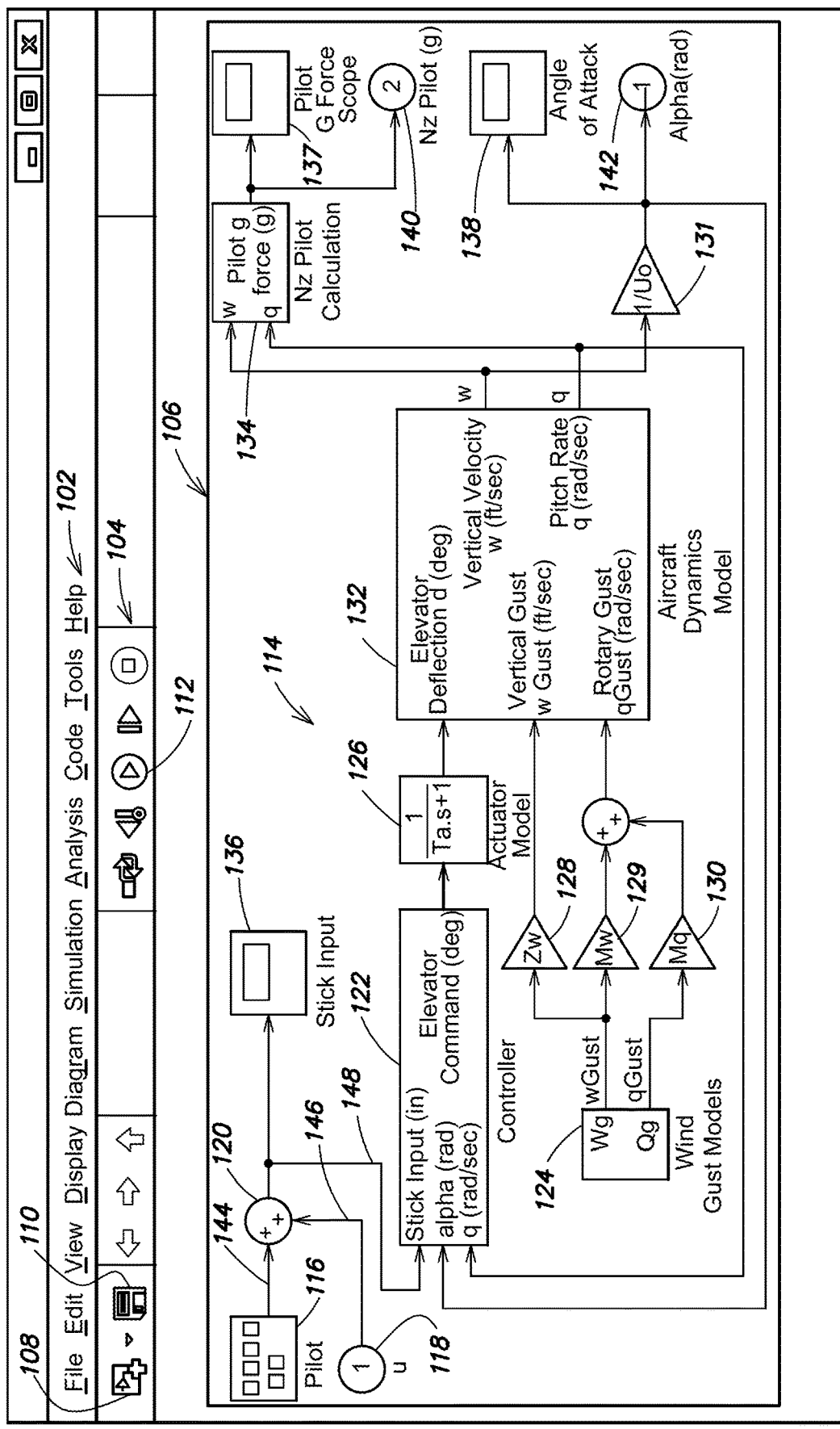
FIG. 1 is a schematic illustration of a model editor window displaying a model in accordance with an embodiment.

Control systems, communications systems, factory automation systems, and other such systems often include processors and/or programmable logic devices that implement procedures or processes. To develop the procedures or processes implemented by such systems, engineers may create one or more models of the system or portions thereof. The models may be computer-based, and may be constructed within a modeling environment application. The models may have executable semantics, and may be executed, for example within the modeling environment. In addition, code may be generated from a model. The generated code may be deployed to and executed by the processors and/or programmable logic devices of the system being developed.

A model may be defined graphically using model elements, such as blocks or icons, which may represent functions, operations, states, etc. Selected model elements may be interconnected by connection elements to define signal, dataflow, control flow, state transition, physical, mathematical, or other relationships among the connected model elements.

Relationships between model elements may be causal and/or non-causal. For example, a model may include a block that represents a continuous-time integration block that may be causally related to a data logging block by using a connection element, which may be graphically represented by an arrow or other line, to connect an output port of the continuous-time integration block to an input port of the data logging model element. Further, during execution of the model, the value stored by the continuous-time integrator may change as the current time of the execution progresses. The value of the state of the continuous-time integrator may be available on the output port and the connection with the input port of the data logging model element may make this value available to the data logging block.

In some implementations, a model element may include or otherwise correspond to a non-causal modeling function or operation. An example of a non-causal modeling function may include a function, operation, or equation that may be executed in different fashions depending on one or more inputs, circumstances, and/or conditions. That is, a non-causal modeling function or operation may include a function, operation, or equation that does not have a predetermined causality.

During execution, a model may receive inputs, perform operations, functions, and/or procedures, and produce outputs. The outputs of a dynamic or time-based model vary over time. A dynamic model may be executed by computing its states at successive time steps over a simulation time of the model. For example, a modeling environment may generate a set of equations for a model, and repeatedly solve the equations at intervals, e.g., time steps, from the simulation start time to the simulation end time. A model's simulation time may differ from actual clock time. For example, while a model may be executed over a simulation time of ten seconds, it may take just a small fraction of that in terms of actual clock time, e.g., milliseconds, for a data processing system to complete the model's execution over the simulation time. The connection elements of a dynamic model may represent signals, which may be time varying quantities that may have values throughout the model's simulation time. The source of a signal may be the model element that writes to the signal during execution of the model element. The destination of a signal may be the model element that reads the signal during execution of the model element. In some modeling environments, such as the Simulink® model-based design environment from The MathWorks, Inc. of Natick, MA, a signal is represented in a model as a single line arrow, where the arrow's tail connects to a port of the source element, and the arrow's head connects to a port of the destination element.

A chain of model elements connected by a sequence of connection elements, such as arrows, may define a path through the model. A given model may include many different paths, and the paths may have many branches. Some paths may start at top-level inputs to the model, and some paths may terminate at top-level outputs of the model. The paths may be signal paths, data paths, control paths, power paths, or state-based information paths, among others.

Groups of model elements within a model may be organized as components. Components may represent hierarchical levels of a model. At a first hierarchical level, a component may be visually represented as a single model element, such as a single block or icon. At a next lower hierarchical level, which may be accessed by opening the component, the component may be represented by the model elements and connection elements that form the component. A component may include one or more input ports and one or more output ports, which may be connected to other portions of the model, such as model elements or other components. In some implementations, a component may include a control port for conditionally controlling the component's execution. A component may itself include other components, thereby establishing multiple hierarchical levels within the model. Exemplary components include subsystems, sub-models, superblocks, and sub-Virtual Instruments (subVIs).

The present disclosure relates to systems and methods for highlighting graphical models. For example, the present disclosure relates to systems and methods for highlighting paths through graphical models. In some embodiments, the systems and methods may identify at least some of the paths that lead from a selected starting location within a model and terminate at the last or final source and/or destination model elements or components of the currently open hierarchical model level. The systems and methods may receive an indication, for example from a user, whether to highlight the paths from the starting location to final sources, to final destinations, or to both final sources and final destinations. The systems and methods may utilize one or more graphical affordances to highlight the identified paths. Exemplary graphical affordances include color, line style, line type, bolding, shadows, animation, etc. The graphical model may include multiple hierarchical levels, and the systems and methods may open a lower hierarchical level relative to the current level, and may highlight the portion of the path at the lower level. The systems and methods also may close a current level, open a higher hierarchical level, and highlight the portion of the path at the higher level. In some implementations, the selected starting location may be a connection element, such as an arrow representing a signal.

In some implementations, the systems and methods may identify sources and destinations that execute within one or a specified number of time steps relative to a time step associated with the starting location. For example, the systems and methods may highlight a path from a starting location to the last source(s) or destination(s) that executes in the same time step as the starting location. This may be in contrast to highlighting a path from a starting location to the last or final source(s) and/or destination(s) within the current hierarchical level, A structural analysis of a model may be performed by analyzing an in-memory intermediate representations (IR) of the model. The IR may indicate signal, data, and/or control dependencies among model elements and components. For example, the IR may be a directed graph whose nodes represent model elements and components, and whose edges represent connection elements. The structural analysis may determine data and control dependencies among model elements and components. In some embodiments, the structural analysis may be performed without compiling or running the model, while in other embodiments, the model may be compiled and/or run.

In some implementations, the systems and methods may use one or more graphical affordances to illustrate an entire path all at once from the starting location to the last or final source(s) or destination(s) at the current hierarchical level. In other implementations, the systems and methods may step through portions of a path. For example, the systems and methods may illustrate a path sequentially in segments beginning at the starting location. A segment may include a next source or destination relative to the current position, as opposed to a final source or destination. The systems and methods may step through illustrations of next segments in response to user input.

In some implementations, the systems and methods may identify the paths from the starting location to a non-direct-feedthrough source or destination. A direct-feedthrough model element may refer to a model element whose output is a function of the current value of an input to the model element. A model element whose output is not a function of the current value of the model element's input is a non-direct-feedthrough model element. In the Simulink® model-based design environment, Gain, Product, and Sum blocks are examples of direct-feedthrough model elements. Examples of non-direct-feedthrough model elements include the Integrator block (its output is a function of its state), the Constant block (it does not have an input), and the Memory block (its output is dependent on its input in the previous time step).

In some embodiments, the systems and methods may identify paths from the starting location to a non-direct-feedthrough input port or output port of a model element. If a value associated with an output port is a function of the value(s) of one or more input ports of a model element, then the output port may be referred to as a direct-feedthrough output port. If the value associated with an output port is not a function of the values of any of the model element's input ports, then the output port may be referred to as a non-direct-feedthrough output port. Furthermore, if the value associated with an output port of a model element is a function of the value of a given input port, then the given input port may be referred to as a direct-feedthrough input port. If none of the values associated with the output ports of a model element are a function of the value associated with a given input port, then the given input port may be referred to as non-direct-feedthrough input port.

FIG. 1 is a schematic illustration of a model editor window 100, which may be generated by a modeling environment and presented on a display of a data processing system. The model editor window 100 may include a plurality of user interface elements that can be operated by a user to construct, edit, run, and save a model, among other operations or tasks. For example, the model editor window 100 may include a menu bar 102, a toolbar 104, and a canvas 106. The menu bar 102 may include a plurality of commands organized into drop-down categories, such as File, Edit, View, Display, etc. The toolbar 104 may include a plurality of graphical command buttons for executing frequently used commands. For example, the toolbar 104 may include a New button 108, a Save button 110, and a Run button 112, among others.

A model 114 may be opened, and visually presented on the canvas 106. The model 114 illustrated in FIG. 1 may simulate the dynamics of an aircraft. For example, the model 114 may receive a sample pilot input, and calculate the g-force on the pilot and the aircraft's angle of attack. The model 114 may include a plurality of model elements and components interconnected by connection elements. In particular, the model 106 may include a Signal Generator block (Pilot) 116 and an Inport block (u) 118 that provide input data, for example in the form of signals, to the model 114. The model 114 may further include a Sum block 120, a first component (Controller) 122, a second component (Wind Gust Models) 124, a Transfer Function block 126, four Gain blocks 128-131, a third component (Aircraft Dynamics Model) 132, a fourth component (Nz pilot calculation) 134, three Scope blocks (Stick Input, Pilot G force Scope, and Angle of Attack) 136-138, and two Outport blocks (Nz Pilot (g) and alpha (rad)) 140 and 142.

The model 114 also may include a plurality of connection elements, which may be in the form of arrows and may represent signals. For example, the model 114 may include a first arrow 144 from the Signal Generator block 116 to the Sum block 120, a second arrow 146 from the Inport block 118 to the Sum block 120, a third arrow 148 from the Sum block 120 to the Controller component 122, and so on. The components 122, 132, and 134 may be subsystem blocks, and may represent a lower hierarchical level of the model 114. The components 122, 132, and 134 may themselves include model elements, connection elements, and other components.

A user may want to know which portions of the model 114 are the last or final destinations of a given starting location in the model 114. An exemplary starting location is the connection element 144. In some embodiments, the user may select the connection element 144, e.g., with a cursor, and the modeling environment may present one or more graphical affordances, such as a pop-up window, containing commands available for the connection element 144. The commands may include a 'Highlight to All Sources' command and a 'Highlight to All Destinations' command. The user may select the 'Highlight to All Destinations' command.

A model analyzer may perform a structural analysis of the model 114. For example, the modeling environment may create one or more in-memory intermediate representations (IRs) of the model 114, and the structural analysis may be performed on the one or more IRs. The analysis may identify signal or other connectivity among the model elements and components of the model 114. The model analyzer may construct a graph, such as a directed graph, of the model 114. A path identification tool may access the graph, and perform a search of the graph to identify the model elements and components that are last or final destinations of the selected connection element 144. For example, the path identification tool may conduct a depth-first or breadth-first search of the graph. The path identification tool may also identify the sequence of model elements and components that lie along the paths leading from the connection element 144 to the final destinations. With respect to the model 114, the path identification tool may determine that the three Scope blocks 136, 137, and 138, and the two Outport blocks 140 and 142 are the last or final destinations of the connection element 144. The path identification tool may alter the appearance of the model, for example, it may present one or more graphical affordances on the model 114 that illustrate the paths through the model 114 from the connection element 144 to the final destinations. In some embodiments, the path identification tool may highlight the paths.

Figure 2:
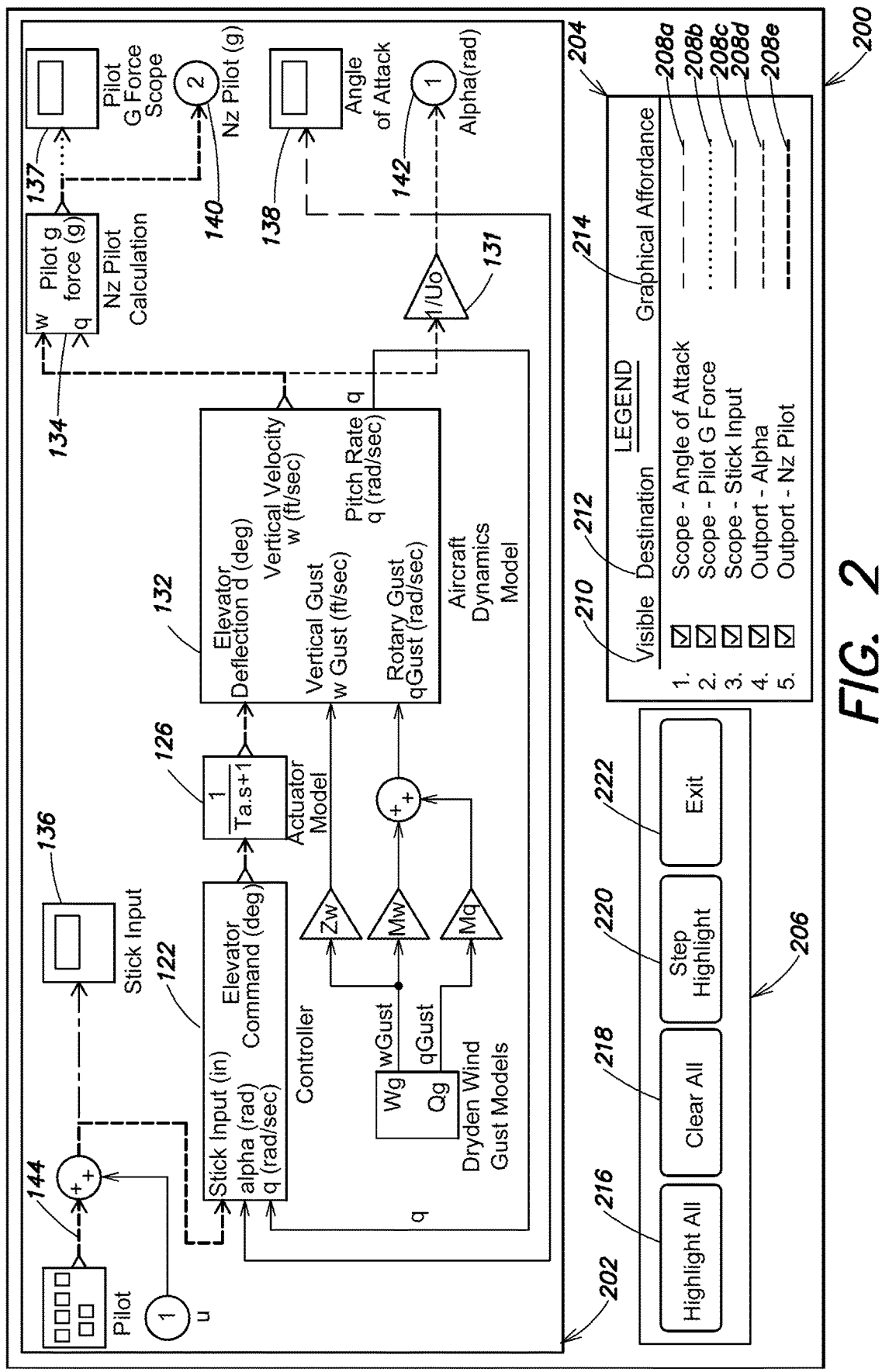
FIG. 2 is a schematic illustration of a presentation of a model in accordance with an embodiment.

FIG. 2 is a schematic illustration of a presentation 200 that includes a model 202, a Legend block 204, and a command bar 206. The model 202 may be a modified version of the source model 114 of FIG. 1, and may be presented on a canvas of a model editor window. The Legend block 204 and the command bar 206 also may be presented on the model editor window. The model 202 may include graphical affordances that highlight, e.g., mark or indicate, the identified paths through the model 114 from the selected element, i.e., the connection element 144, to the last or final destinations. The Legend block 204 may include a plurality of entries 208a-e that provide a key for the graphical affordances appearing in the model 202. The graphical affordances may be arrows having different dash types in place of the single solid line arrows used in the source mode 114. As indicated by the entries 208a-e in the Legend block 204, there are five last or final destinations in the model 114 for the connection element 144: the three Scope blocks 138, 137, and 136; and the two Outport blocks 142. The paths to these five destinations are illustrated using arrows with different dash types. For example, the path from the connection element 144 to the Nz Pilot (g) Output block 140, which includes the Sum block, the Controller component 122, the Transfer Function block 126, the Aircraft Dynamics Model component 132, and the Nz pilot calculation component 134, is indicated by arrows with a medium length dash type. Other paths are visually depicted using a two-dot/one-dash type, a one-dot/one-dash type, a long length dash type, and a short length dash type.

The Legend block 204 may include a Visible column 210 that may be used to turn the respective graphical affordance On and Off. For example, the Visible column 210 may have checkboxes for the entries 208. If the checkbox for an entry 208 is checked, then the respective graphical affordance may appear in the model 202. If a checkbox is unchecked, then the respective graphical affordance may not appear in the model 202. For example, the connection elements may revert to their original appearance, e.g., solid single line arrows. The Legend block 204 may further include a Destination column 212 that identifies, e.g., by name, the respective last or final destination, and a Graphical Affordance column 214 that provides a description of the graphical affordance, e.g., the dash type, being used to illustrate the respective entry.

The command bar 206 may include a plurality of command buttons, such as a 'Highlight All' button 216, a 'Clear All' button 218, a 'Step Highlight' button 220, and an 'Exit' button 222. Selection of the 'Highlight All' button 216 may cause all of the paths to be represented with graphical affordances. Selection of the 'Clear All' button 218 may cause all of the graphical affordances to be cleared from the model 202, without closing the Legend block 204 or the command bar 206. Selection of the 'Step Highlight' button 220 may cause the Legend block 204 and the command bar 206 to be removed from the presentation 200, and for another command bar to be presented for performing additional path tracing operations, as described herein. Selection of the 'Exit' button may cause all of the graphical affordances to be cleared from the model 202, and for the Legend block 204 and the command bar 206 to be closed, thus reverting back to the original source model 114.

It should be understood that FIG. 2 is meant for illustrative purposes only, and that other presentations may be used. For example, instead of using arrows with different dash types, the graphical affordances may be colors, line styles, bold types, shadows, animation, lowlighting, etc., or combinations thereof. Lowlighting may include changing the graphical appearance of all the model elements that are not part of the path, such that the path itself is shown with a normal appearance but everything else, e.g., other model elements and arrows/lines may be, for example, grayed out. In addition, in some embodiments the Legend block 204 and the command bar 206 may be combined in a single pop-up window, dialog, or other graphical affordance. In some embodiments, the graphical affordance may be moved around a model editor window and/or docked to one or more window locations.

Figure 3:
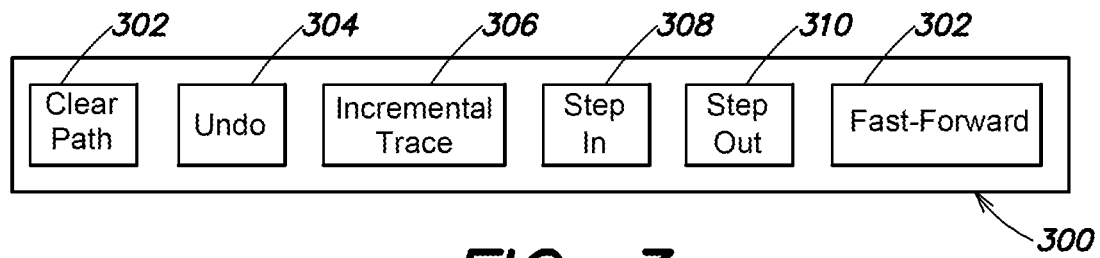
FIG. 3 is a schematic illustration of a command bar in accordance with an embodiment.

FIG. 3 is a schematic illustration of a command bar 300 that may be presented in response to selection of the Step Highlight command 220 (FIG. 2). The command bar 300 may be utilized to step through the segments of a given path and/or to view the portions of a path at another hierarchical level of the model. In some embodiments, the command bar 300 may include a 'Clear Path' command button 302, an 'Undo' command button 304, an 'Incremental Trace' command button 306, a 'Step In' command button 308, a 'Step Out' command button 310, and a 'Fast-Forward' command button 312. The Clear Path command button 302 may cause the graphical affordance for a current path to be removed. The Undo command button 304 may reverse the action performed from a just previous selection of the Incremental Trace command button 306. The Incremental Trace command button 306 may cause a graphical affordance to be presented on a next upstream block, if tracing sources, or a next downstream block, if tracing destinations. The Step In command button 308 may descend one level in the model's hierarchy, for example by opening a component to see the path within the component. The Step Out command 310 may ascend one level in the model's hierarchy, for example by closing the current level, e.g., component. The Fast-Forward command button 312 may cause one or more graphical affordances to be presented to show the entire path to the last or final source(s) or destination(s) at the current hierarchical level, or to a specific number of upstream or downstream blocks.

Figure 4:
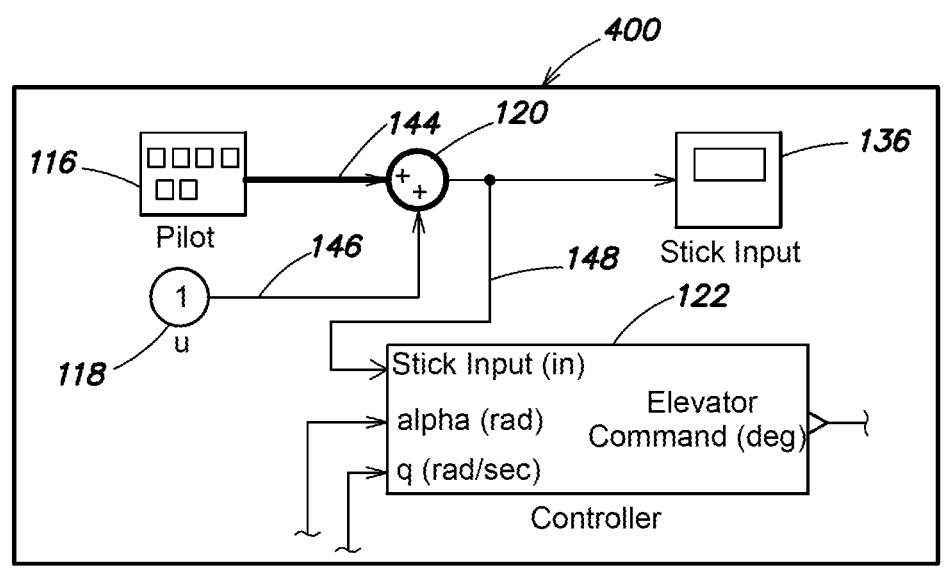
FIG. 4 is a schematic illustration of a portion of a model in accordance with an embodiment.
Figure 5:
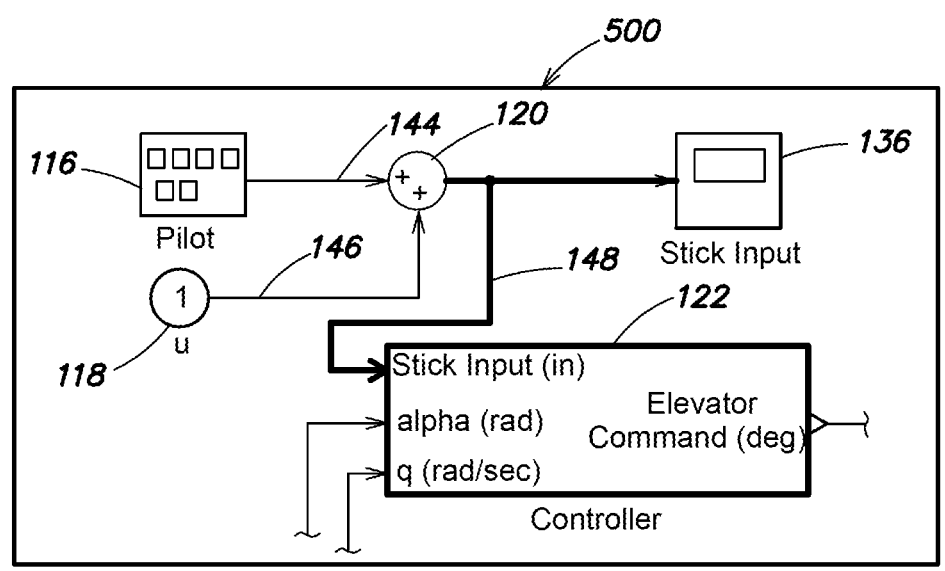
FIG. 5 is a schematic illustration of a portion of a model in accordance with an embodiment.

Suppose the user selects the Incremental Trace command button 306. A path stepping tool may present one or more graphical affordances on the model 114 that highlight the first downstream block or component if tracing destinations or the first upstream block or component if tracing sources relative to the starting location, i.e., the signal 144. FIG. 4 is a schematic illustration of a portion 400 of the model 114. The starting location, i.e., signal 144, and the first downstream block, i.e., the Sum block 120, are highlighted. In this embodiment, the graphical affordance is shadowing. Suppose the user again selects the Incremental Trace command button 306. The path stepping tool may present one or more graphical affordances on the model 114 that highlight the next downstream block or component relative to the currently highlighted block or component, i.e., relative to the Sum block 120. FIG. 5 is a schematic illustration of a portion 500 of the model 114. Here, the next signal, i.e., the signal 148, and the next downstream block or component, i.e., the Controller component 122, are highlighted. Again, the graphical affordance is shadowing.

Suppose the user wants to see the current path at a next lower level of the hierarchy of the model 114. With the Controller component highlighted, as illustrated in FIG. 5, the user may select the Step In command 308. In response, a hierarchical traversing tool may open the component, thereby displaying a next lower hierarchical level, and the path stepping tool may highlight the portion of the path through the component using one or more graphical affordances.

Figure 6:
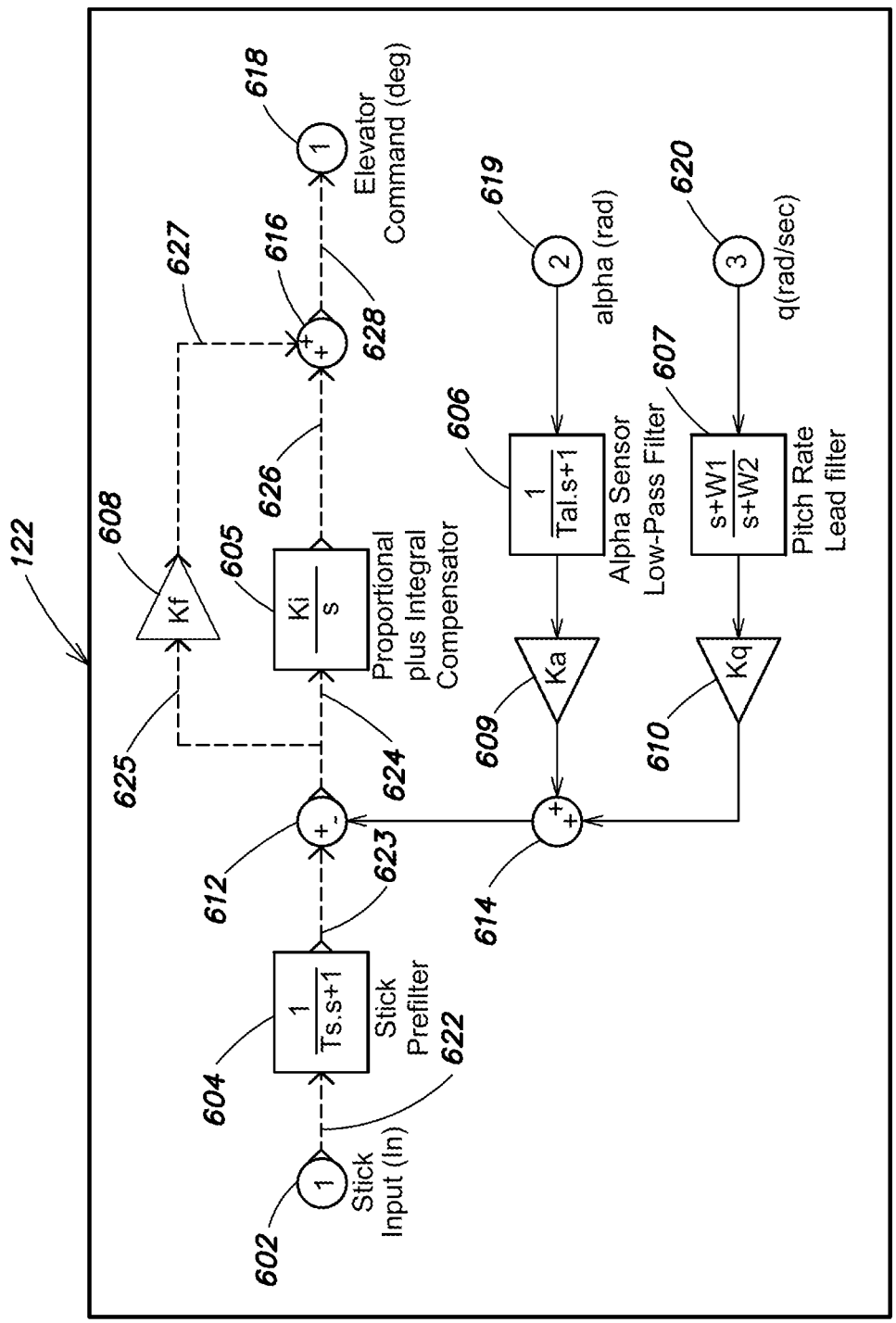
FIG. 6 is a schematic illustration of a model component in accordance with an embodiment.

FIG. 6 is a schematic illustration of the Controller component 122 as appearing at a next lower hierarchical level of the model 114, for example by opening the Controller component 122. The Controller component 122 may include a plurality of model elements interconnected by connection elements. For example, the Controller component 122 includes an Inport block 602, four transfer function blocks 604-607, three gain blocks 608-610, a subtract block 612, two sum blocks 614 and 616, and three outport blocks 618-620. The transfer function blocks 604-607 may implement a transfer function of the Laplace-domain variable s in order to model linear systems. In some embodiments, the entire path through the component may be highlighted with one or more graphical affordances. For example, the signals of the Controller component 122 that are along the path from the signal 144 to the Nz Pilot (g) Outport block 140 may be marked, e.g., with a dashed line type. As indicated in FIG. 6, the path through the Controller component 122 includes seven arrows 622-628, and the arrows may represent signals.

In some embodiments, rather than highlight the entire path, the path stepping tool may initially highlight just the first signal, i.e., the arrow 622, and the first destination model element or component, i.e., the transfer function block 604. In response to the selection of the Incremental Trace command 306, the path stepping tool may highlight the next signal, i.e., the arrow 623, and the next destination model element or component, i.e., the Subtract block 612. The path stepping tool may proceed to sequentially highlight the next downstream signal and model element or component in response to further selections of the Incremental Trace command 306.

If a next downstream signal represents a branch to two or more downstream model elements, the path stepping tool may highlight one downstream model element, e.g., a portion of the branch. Alternatively, the path stepping tool may highlight all of the downstream model elements, e.g., the entire branch. Referring to the Subtract block 612, for example, the path stepping tool may highly signal 625 and Gain block 608, signal 624 and transfer function block 605, or both signals 625 and 624 and both blocks 608 and 605. The determination whether to highlight a portion of a branch or the entire branch may be made programmatically or based on user input. For example, a graphical affordance, such as a popup widget, may be displayed. The path stepping tool may select the portion of the branch to highlight based on user input received at the popup widget.

Modeling Environment

Figure 7:
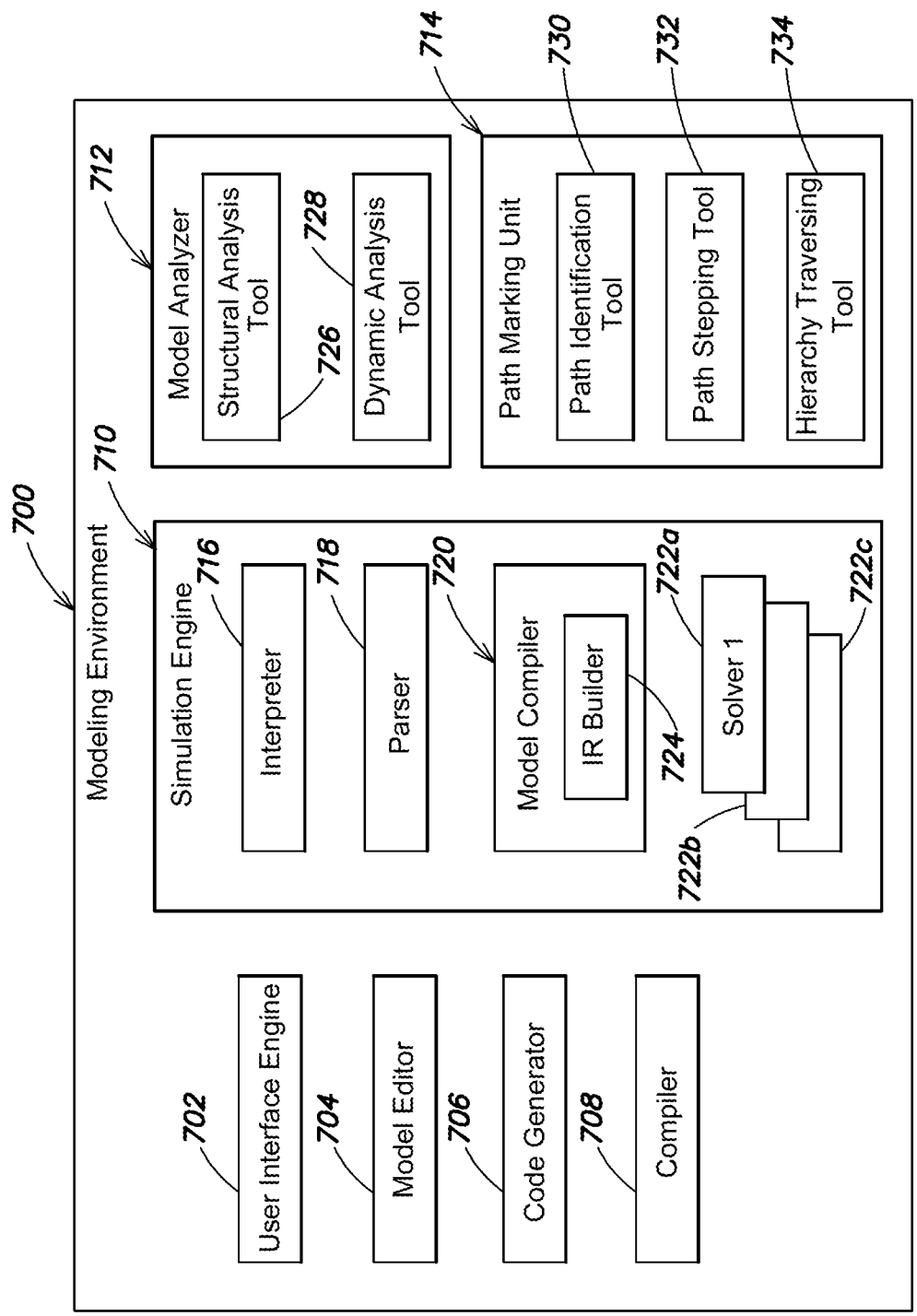
FIG. 7 is a partial, schematic illustration of a modeling environment in accordance with an embodiment.

FIG. 7 is a partial, schematic illustration of a modeling environment 700 in accordance with an embodiment. The modeling environment 700 may include a User Interface (UI) engine 702, a model editor 704, a code generator 706, a compiler 708, a simulation engine 710, a model analyzer 712, and a path marking unit 714. The UI engine 702 may create and present one or more User Interfaces (UIs), such as Graphical User Interfaces (GUIs) and/or Command Line Interfaces (CLIs), on the display of a workstation, laptop, tablet, or other data processing device. The GUIs and CLIs may provide a user interface to the modeling environment 700, such as a model editing window. The model editor 704 may perform selected operations on a model, such as open, create, edit, and save, in response to the user inputs or programmatically.

The simulation engine 710 may include an interpreter 716, a parser 718, a model compiler 720, and one or more solvers, such as solvers 722a-c. The model compiler 720 may include one or more Intermediate Representation (IR) builders, such as IR builder 724. In some implementations, one or more IR builders may be included or associated with the solvers 722. The simulation engine 710 may execute, e.g., compile and run or interpret, computer-generated, executable models using one or more of the solvers 722*a-c*. For example, the solvers 722 may generate a set of equations for a model, and may solve the set of equations. The solvers 722 may also generate a solution for an in-memory, intermediate representation (IR) of a model that represents a set of equations. The solvers 722 may generate the solution for the IR using numerical techniques, for example. Exemplary solvers include one or more fixed-step continuous time solvers, which may utilize numerical integration techniques, and one or more variable-step solvers, which may for example be based on the Runge-Kutta and Dormand-Prince pair. With a fixed-step solver, the step size remains constant throughout simulation of the model. With a variable-step solver, the step size can vary from step to step, for example to meet error tolerances. A non-exhaustive description of suitable solvers may be found in the Simulink 7 User's Guide from The MathWorks, Inc. (March 2016 ed.)

The model analyzer 712 may include a structural analysis tool 726 and a dynamic analysis tool 728. The path marking unit 714 may include a path identification tool 730, a path stepping tool 732, and a hierarchy traversing tool 734.

In some implementations, the code generator 706 and/or the compiler 708 may be separate from the modeling environment 700. The code generator 706 may access a model, e.g., from memory, and generate code for the model. In some embodiments, the generated code may be source code, which may be compiled by the compiler 708, and executed by one or more processors outside of the modeling environment 700. In some embodiments, the generated code may be Hardware Description Language (HDL) code, such as VHDL, Verilog, or SystemC, among others, which may be used to synthesize a programmable logic device. In some implementations, the generated code may conform to one or more programming languages, such as Ada, Basic, C, C++, C #, FORTRAN, or MATLAB, among other, or it may be assembly code, Exemplary modeling environments include the MATLAB® technical computing environment (TCE) and the Simulink® model-based design environment from The MathWorks, Inc., as well as the Simscape™ physical modeling system and the Stateflow® state chart tool also from The MathWorks, Inc., the MapleSim physical modeling and simulation tool from Waterloo Maple Inc. of Waterloo, Ontario, Canada, the LabVIEW virtual instrument programming system and the NI MatrixX model-based design product both from National Instruments Corp. of Austin, TX, the Visual Engineering Environment (VEE) product from Agilent Technologies, Inc. of Santa Clara, CA, the System Studio model-based signal processing algorithm design and analysis tool and the SPW signal processing algorithm tool from Synopsys, Inc. of Mountain View, CA, a Unified Modeling Language (UML) system, a Systems Modeling Language (SysML) system, the System Generator system from Xilinx, Inc. of San Jose, CA, and the Rational Rhapsody Design Manager software from IBM Corp. of Somers, NY. Models created in the high-level modeling environment may contain less implementation detail, and thus operate at a higher level than certain programming languages, such as the C, C++, C #, and SystemC programming languages.

Those skilled in the art will understand that the MATLAB® TCE is a math-oriented, textual programming environment for digital signal processing (DSP) design, among other uses. The Simulink® model-based design environment is a modeling tool for modeling and simulating dynamic and other systems, among other uses. The MATLAB® and Simulink® environments provide a number of high-level features that facilitate algorithm development and exploration, and support model-based design. Exemplary high-level features include dynamic typing, array-based operations, data type inferencing, sample time inferencing, and execution order inferencing, among others.

Models constructed within the modeling environment 700 may include textual models, graphical models, such as block diagrams, state-based models, and combinations thereof. A given model may simulate, e.g., approximate the operation of, a system.

In some embodiments, one or more of the user interface engine 702, the model editor 704, the code generator 706, the compiler 708, the simulation engine 710, the model analyzer 712, and the path marking unit 714 may be implemented through one or more software modules or libraries containing program instructions that perform the methods described herein. The software modules may be stored in a memory, such as a main memory, a persistent memory and/or a computer readable media, of a workstation, server, or other data processing machine or device, and executed by one or more processors. Other computer readable media may also be used to store and execute these program instructions, such as non-transitory computer readable media, including optical, magnetic, or magneto-optical media. In some embodiments, one or more of the user interface engine 702, the model editor 704, the code generator 706, the compiler 708, the simulation engine 710, the model analyzer 712, and the path marking unit 714 may comprise hardware registers and combinational logic configured and arranged to produce sequential logic circuits. In some embodiments, various combinations of software and hardware, including firmware, may be utilized to implement the described methods.

A model, such as a graphical model, may be executed by the simulation engine 710. For example, a user may select the Run command button 112 of the command toolbar 104. Alternatively, a user may enter a text-based command in a CLI. A model may also be executed programmatically. Model execution may include a compile stage, a link stage, and a simulation loop stage. The compile and link stages may be performed by the model compiler 720 of the simulation engine 710. The compile stage may mark the start of execution of the model, and may involve preparing data structures and evaluating parameters, configuring and propagating model element characteristics (e.g., sample times, data types, etc.), determining block connectivity, performing block reduction and block insertion, and generating a sorted order of the equations corresponding to the individual blocks of the model. Block reduction may include collapsing and/or reducing one or more groups of blocks. For example, blocks or signals determined to be in an unused code path, e.g., dead code, rate transition blocks whose input frequency is faster than their output frequency, and type conversion blocks determined to be unnecessary may be collapsed or removed.

The preparation of data structures and the evaluation of parameters may create and initialize one or more data structures used in the compile stage. For each of the blocks, a method may force the block to evaluate all of its parameters. This method may be called for all blocks in the design model. If there are any unresolved parameters, execution errors may be thrown. During the configuration and propagation of block and port/signal characteristics, the compiled attributes (such as data dimensions, data types, complexity, sample modes, and sample time) of each model element (and/or ports) may be setup on the basis of the corresponding behaviors and the attributes of model elements (and/or ports) that are connected to the given model element through lines, e.g., arrows. Attributes may also be setup based on the context of a model element or a component in a model. For example, a subsystem that has a given sample time may have this sample time be set to the sample time of blocks that the subsystem contains.

The attribute setup may be performed through a process during which block behaviors "ripple through" the design model from one block to the next following signal or other connectivity, as well as through the hierarchical structure of the model, and may for example follow connectivity in a forward or backward manner. This process is referred to as "propagation." In the case of a model element that has explicitly specified its model element behaviors or the behaviors of its ports, propagation may help ensure that the attributes of the model element are compatible with the attributes of the model elements connected to it or contained by it. If not, an error may be issued. At least some model elements may be implemented to be compatible with a wide range of attributes. Such model elements may adapt their behavior in accordance with the attributes of the model elements connected to them. The exact implementation of the model element may be chosen on the basis of the model in which the model element is located. Included within this step are other aspects such as validating that all rate-transitions yield deterministic results, and that the appropriate rate transition blocks are being used.

The compilation step also may determine model element connectivity. For example, a model may include one or more virtual blocks that may play no semantic role in the execution of the model. In this step, the virtual blocks may be optimized away, e.g., removed, and the remaining non-virtual model elements may be reconnected to each other appropriately. This compiled version of the model with actual model element connections may be used from this point forward in the execution process.

One or more in memory representations, such as intermediate representations (IRs), may be generated for the model by the IR builder 724. At least one of the IRs may be in the form of a directed graph, such as a hierarchical, Data Flow Graph (DFG) having a plurality of nodes interconnected by edges. The nodes of the IR may represent model elements from the executable graphical model, the edges of the IR may represent connections among the model's model elements. Special nodes of the IR may be used to provide hierarchy in the IR, for example, by abstractly representing subsystems or other components of the model. In some implementations, model elements of the model may map to one or more nodes of the IR, and lines or arrows of the model may map to one or more edges of the IR.

It should be understood that an IR may take other forms, such as a Control Flow Graph (CFG), Control Data Flow Graph (CDFG), program structure tree (PST), abstract syntax tree (AST), a netlist, etc. A CDFG may capture the control flow as well as the data flow of a graphical model through data dependency and control dependency edges.

The in-memory representation or IR may be stored in memory, such as the main memory or a persistent memory of a data processing device.

Following the compilation stage, code may or may not be generated for the model. If code is generated, the model may be executed through an accelerated execution mode in which the model, or portions of it, is translated into either software modules or hardware descriptions, which is broadly referred to herein as code. If this stage is performed, then the stages that follow may use the generated code during the execution of the model. If code is not generated, the model may execute in an interpretive mode in which the compiled and linked version of the model may be directly utilized to execute the model over the desired time-span. When users generate code for a model, they may choose to not proceed further with the model's execution. Instead, they may choose to take the generated code and deploy it outside of the confines of the modeling environment 700.

The link stage may involve memory allocation, and generation of a block method execution list from the sorted order. In an embodiment, once the compilation and link stages are completed, the sorted order may not be changed for the entire duration of the model's execution. During the simulation loop stage, the compiled and linked version of the model may be directly utilized by the simulation engine 710 to execute the model in an interpreted mode. The way in which the input and output of model elements are interconnected in the model does not necessarily define the order in which the equations (methods) corresponding to the individual model elements will be solved (executed). The actual order may be determined during the sorting step in compilation.

Static (Execution Unaware) Mode

Tracing to Final Destinations/Sources

Figure 8A:
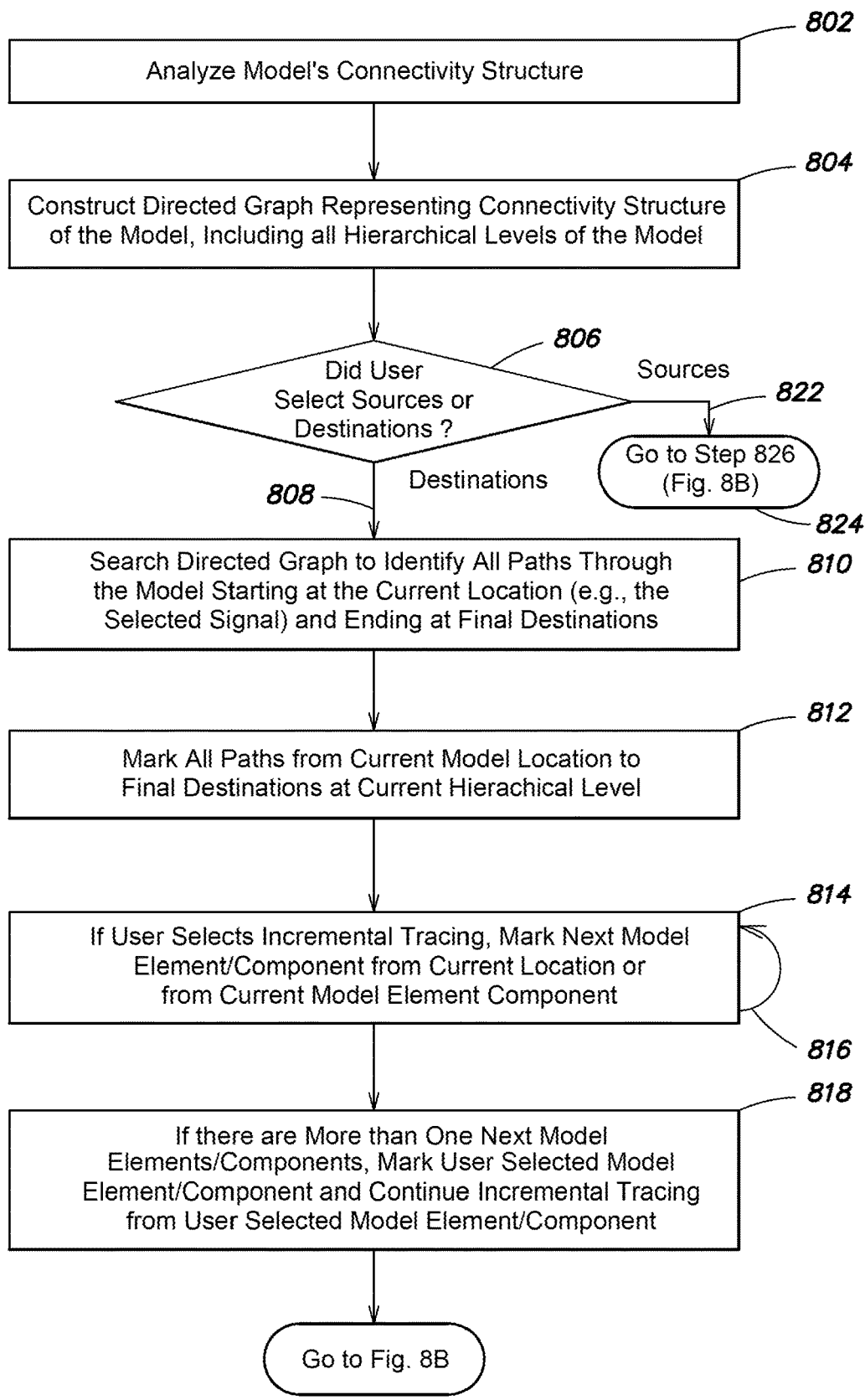
FIGS. 8A and 8B are partial views of a flow diagram of a method in accordance with an embodiment.
Figure 8B:
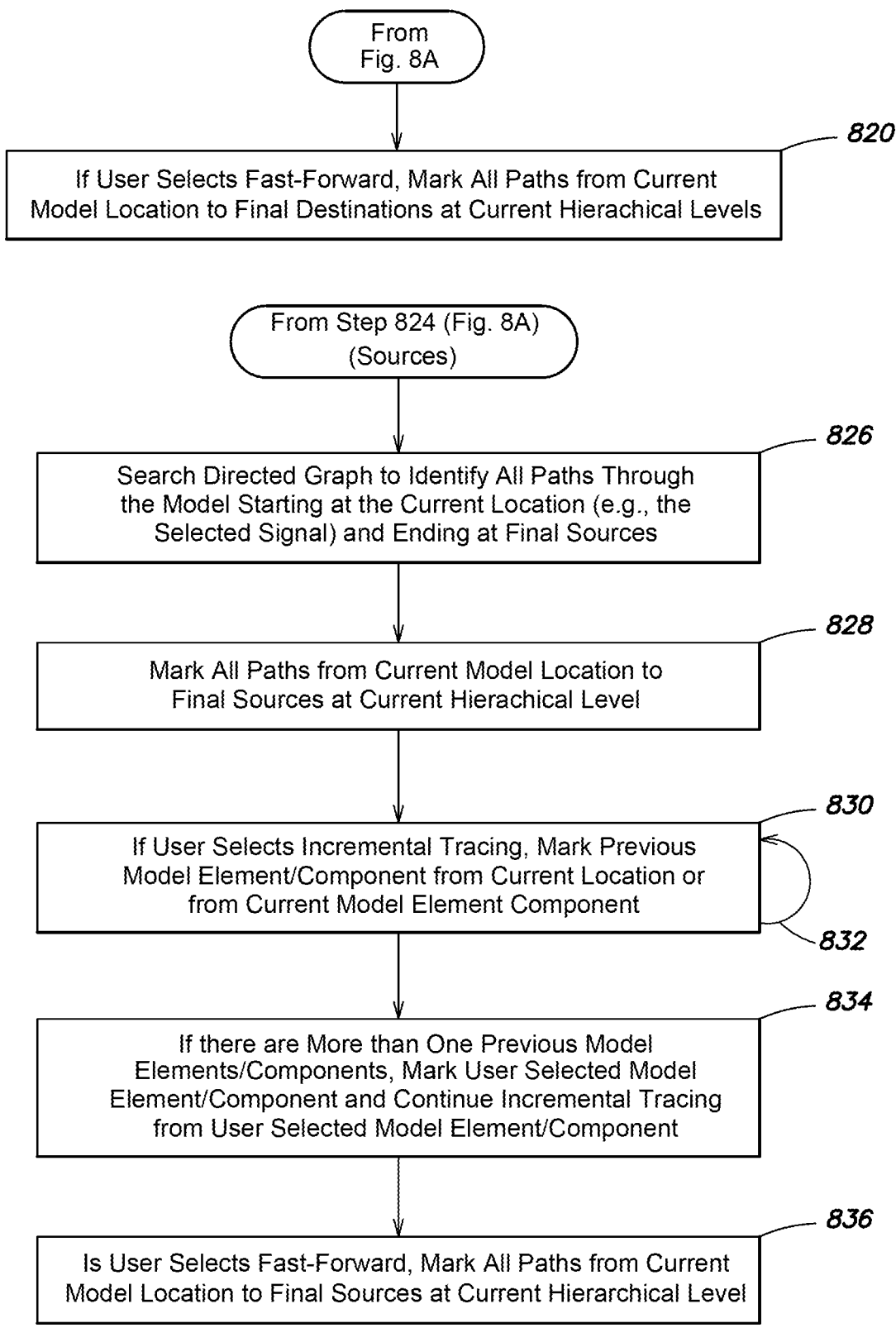

FIGS. 8A and 8B are partial views of a flow diagram of a method in accordance with an embodiment.

The model analyzer 712 and in particular the structural analysis tool 726 may access a model, and may analyze the model's connectivity structure, as indicated at step 802. For example, the structural analysis tool 726 may determine the data and/or control dependencies among the model's elements and components. The structural analysis tool 726 may perform static analysis using one or more formal methods, such as model checking and/or abstract interpretation. The structural analysis tool 726 may construct a graph, such as a directed graph, that represents the connectivity structure of the model, as indicated at step 804. The graph may include nodes representing model elements of the model, and edges representing the relationships between model elements, for example connection elements of the model. In some embodiments, the graph may include special nodes that represent components and the special nodes may reference other graphs that represent the connectivity structures of the respective components of the model. In some embodiments, the model may be flattened, and a single graph may be constructed.

The path identification tool 730 may determine whether the user chose to see the paths to final sources or final destinations, as indicated at decision block 806. If the user selected final destinations, the path identification tool 730 may search the graph, and identify all paths through the model starting at a given or current location in the model, and leading to all final destinations, as indicated by arrow 808 (labeled Destinations) leading to step 810.

In some implementations, the path identification tool 730 may designate a model element as a destination if the model element 1. has no output ports,
2. has no connected output ports, e.g., the model element has one or more output ports, but none of them are connected to a model element, component, or connection element of the model,
3. has all of its downstream model elements commented out,
4. represents a boundary between modeling domains, e.g., domain conversion blocks,
5. represents a boundary between model element attributes, e.g., a rate transition from one sample rate to another sample rate, or a data type conversion, 6. designated, for example, by a user, as a destination, e.g., by indicating which signals should be considered 'output' of a transfer function analysis,
7. corresponds to a particular type of model element, e.g., a variant subsystem block or a variant selection block, or a non-direct-feedthrough block.

A portion of a program, such as a block of code, may be commented out by adding comment syntax to the block of code so that it will not be executed in the final program. In a graphical model, a block may have a Comment_Out property. If the Comment_Out property of a model element is set to True, the model element may be considered to be "commented out", and may not execute during execution of the model.

An example of a domain conversion block is the Physical Signal (PS) to Simulink converter block that converts a physical signal, e.g., representing energy flow, defined in a physical modeling domain to a signal defined in a dynamic modeling domain.

Exemplary destinations from the Simulink® model-based design environment include Outport blocks, To File blocks, To Workspace blocks, Terminator blocks, and Data Store Memory Write blocks, among others.

The path identification tool 730 may highlight the paths from the current location to all final destinations on a visual presentation of the model, as indicated at step 812. If the user selects incremental tracing, e.g., selecting the Incremental Trace command 306, the path stepping tool 732 may highlight a next connection element and/or model element from a current location along the path to the final destinations, as determined by the model's data and/or control dependencies, as indicated at step 814. The process of sequentially highlighting a next connection element and/or model element may be repeated in response to additional selections of a step command, e.g., selecting the Incremental Trace command 306, as indicated by arrow 816, which loops back on step 814. If there is more than one next connection element and/or model element along the path, the path stepping tool 732 may indicate the various connection and/or model elements to the user, e.g., using one or more graphical affordances, and may receive a selection, e.g., from the user, of a particular connection element and/or model element. For example, a graphical affordance, such as one or more popup windows or other widgets, may be presented through which a particular connection and/or model element may be selected. The path stepping tool may highlight the selected connection element and/or model element, as indicated at step 818. In addition, further incremental stepping along the path may proceed from the user selected connection element and/or model element, as also indicated at step 818. If the user selects the fast-forward command 312, the path stepping tool 732 may highlight all paths from the current location to the final destinations, as indicated at step 820 (FIG. 8B).

Returning to decision block 806 (FIG. 8A), suppose the user chose to see sources for the current location in the model, or both final sources and destinations.

In some implementations, the path identification tool 730 may designate a model element as a source if the model element
1. has no input ports,
2. has no connected input ports, e.g., the model element has one or more input ports, but none of them are connected to a model element, component, or connection element of the model,
3. has all of its upstream model elements all commented out, or
4. represents a boundary between modeling domains, e.g., domain conversion blocks.

Another example of a domain conversion block is the Simulink to Physical Signal (PS) converter block that converts a signal defined in a dynamic modeling domain to a physical signal, e.g., representing energy flow, defined in a physical modeling domain.

Exemplary sources from the Simulink® model-based design environment include Inport blocks, From File blocks, From Workspace blocks, Signal Generator blocks, Clock blocks, Constant blocks, and Data Store Memory Read blocks, among others. The path identification tool 730 may search the graph, and identify all paths through the model starting at a given or current location in the model, and leading to all sources, as indicated by arrow 822 (labeled Sources) leading via Go To step 824 to step 826 (FIG. 8B). The path identification tool 730 may highlight the paths from the current location to all final sources, as indicated at step 828. If the user selects incremental tracing, e.g., selecting the Incremental Trace command 306, the path stepping tool 732 may highlight a previous connection element and/or model element from a current location along the path to the final sources, as indicated at step 830. The process of sequentially highlighting a previous connection element and/or model element may be repeated in response to additional selections of a step command, e.g., selecting the Incremental Trace command 306, as indicated by arrow 832, which loops back on step 830. If there is more than one previous connection element and/or model element along the path, the path stepping tool 732 may indicate the alternatives to the user, for example through one or more graphical affordances. In response to receiving a selection of a particular connection element and/or model element, e.g., as entered by the user, the path stepping tool 732 may highlight the selected connection element and/or model element, as indicated at step 834. In addition, further incremental stepping along the path may proceed from the user selected connection element and/or model element, as also indicated at step 834. If the user selects the fast-forward command 312, the path stepping tool 732 may highlight all paths from the current location to the final sources, as indicated at step 836.

Stepping Down the Model Hierarchy

Figure 9:
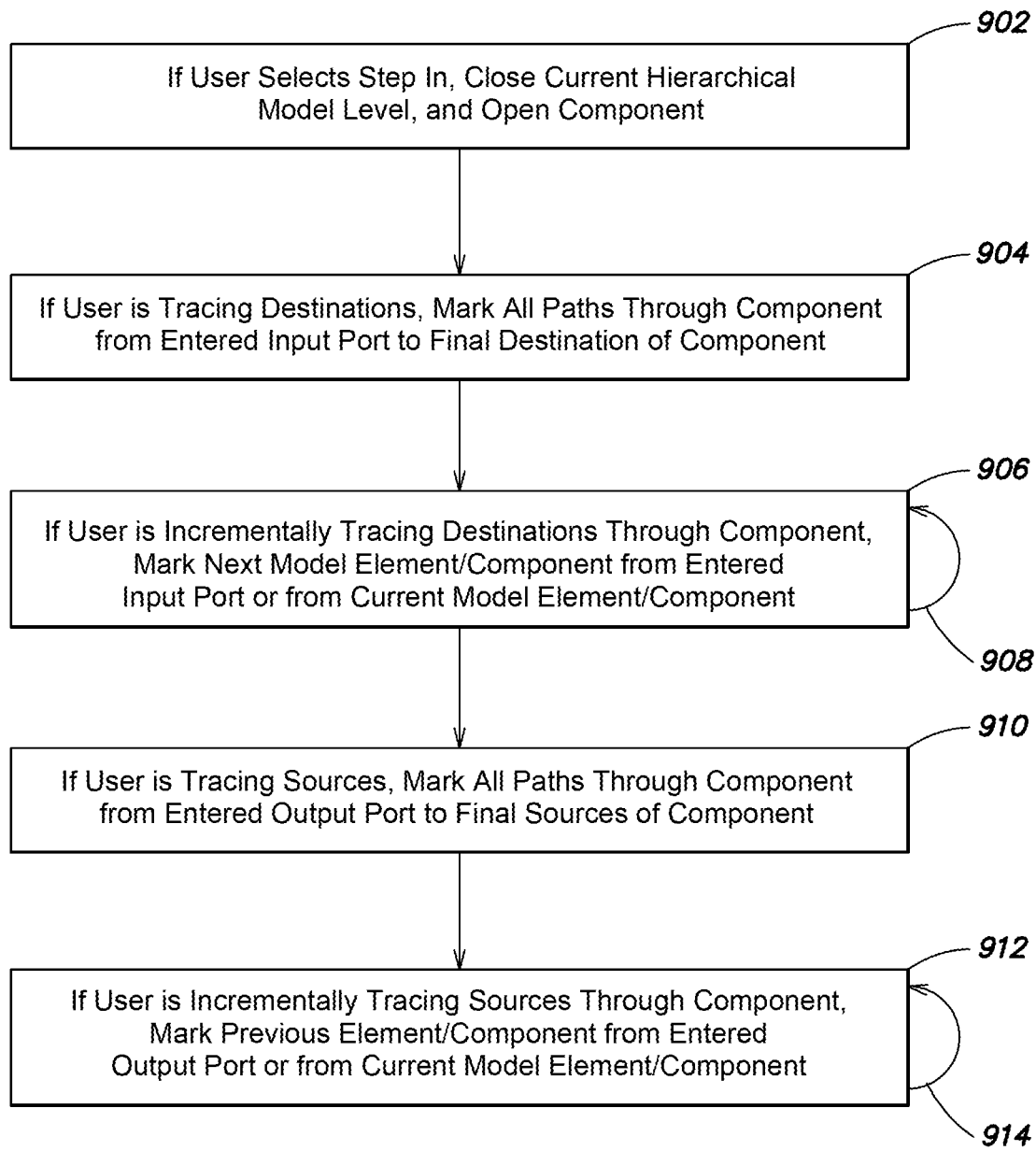
FIG. 9 is a flow diagram of a method in accordance with an embodiment.

FIG. 9 is a flow diagram of a method in accordance with an embodiment. In response to selection of the Step In command button 308 (FIG. 3), the hierarchy traversing tool 734 may close the current model level as presented on the canvas 106, and open the selected component on the canvas 106, as indicated at step 902. If final destinations are being traced, the path identification tool 730 may highlight the path through the component as opened on the canvas 106 from the entry point to the component, which may be an input port of the component, to the final destinations of the component, as indicated at step 904. In some implementations, a final destination may be a port, for example an output port of a component, such as a subsystem or a submodel. The path identification tool 730 may thus trace a path from an entry point of a component to an output port of the component. An example of tracing a path through a component to destinations is illustrated in FIG. 6.

If the user selects incremental tracing for destinations, e.g., selecting the Incremental Trace command 306, the path stepping tool 732 may highlight a next connection element and/or model element from a current location along the path to the final destinations, as indicated at step 906. The process of sequentially highlighting a next connection element and/or model element may be repeated in response to additional selections of a step command, e.g., selecting the Incremental Trace command 306, as indicated by arrow 908, which loops back on step 906.

If sources are being traced, the path identification tool 730 may highlight the path through the component as opened on the canvas 106 from the entry point to the component, which may be an output port of the component, to the final sources of the component, as indicated at step 910. In some implementations a final source may be a port, for example an input port of a component, and the path identification tool 730 may trace a path from an entry point of a component to an input port of the component. If the user selects incremental tracing for sources, e.g., selecting the Incremental Trace command 306, the path stepping tool 732 may highlight a previous connection element and/or model element from a current location along the path to the final sources, as indicated at step 912. The process of sequentially highlighting a next connection element and/or model element may be repeated in response to additional selections of a step command, e.g., selecting the Incremental Trace command 306, as indicated by arrow 914, which loops back on step 912.

Stepping down through a model's hierarchical levels may be continued until a lowest level, e.g., a leaf level, of the model hierarchy is reached. In some embodiments, stepping down through a model's hierarchical levels may be continued until a particular type of component is reached, such as a nonvirtual subsystem, a conditionally executed subsystem, an atomic subsystem, a function-call subsystem, an atomic subchart, an AND substrate, an OR substrate, a referenced model, a masked subsystem, etc. In some implementations, the path marking unit 714 may receive a criterion that indicates a component not to be opened, while stepping down through a model's hierarchical levels. The criterion may be user specified, and may be based on a particular input such as a bus input, based on particular content such as noncausal model elements, etc.

By stepping down a model's hierarchy, a user can find sources, such as Inport blocks, Constant blocks, Signal Builder blocks, and other source blocks, that are located within model components.

Stepping Up the Model Hierarchy

Figure 10:
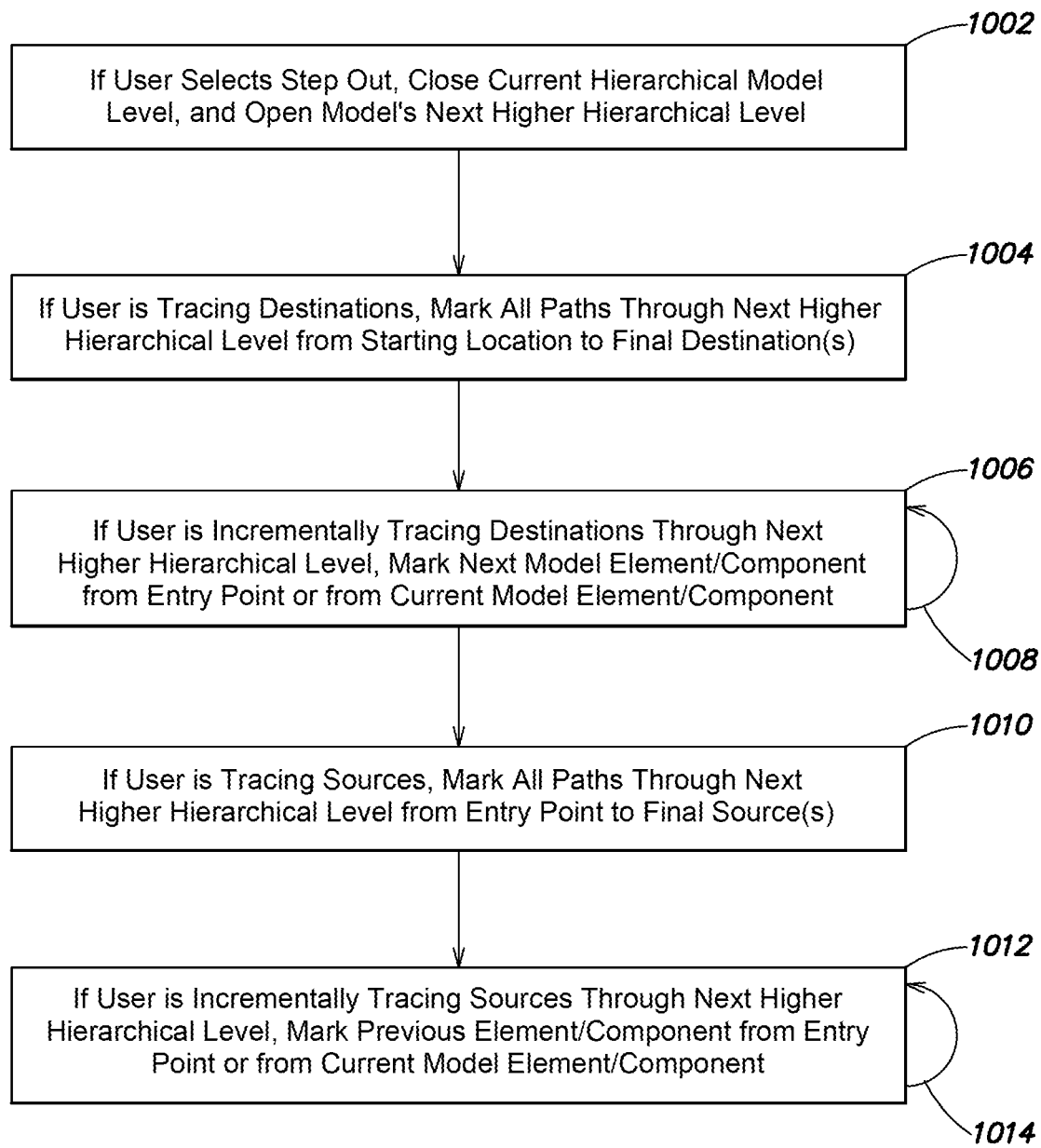
FIG. 10 is a flow diagram of a method in accordance with an embodiment.

FIG. 10 is a flow diagram of a method in accordance with an embodiment. In response to selection of the Step Out command button 310 (FIG. 3), the hierarchy traversing tool 734 may close the currently opened component presented on the canvas 106, and open the model at the next higher hierarchical level relative to the component being closed, as indicated at step 1002. The component being closed may appear in the next higher model level as a single model element, such as a subsystem block, a model reference block, a sub Virtual Instrument (subVI) block, a superblock, etc., in the hierarchical level of the model now presented on the canvas 106. If final destinations are being traced, the path identification tool 730 may highlight the path through the current view of model as now presented on the canvas 106 to the final destinations, as indicated at step 1004. If the originally selected starting location, e.g., arrow 144, is present on the current model view, the highlighted path may start at the starting location. If the starting location is at a higher hierarchical level than the current model view, the path identification tool 730 may highlight the path from the entry point of the current model view to the final destinations.

If the user selects incremental tracing for destinations, e.g., selecting the Incremental Trace command 306, the path stepping tool 732 may highlight a next connection element and/or model element from a current location along the path to the final destinations of the currently presented hierarchical level, as indicated at step 1006. The process of sequentially highlighting a next connection element and/or model element may be repeated in response to additional selections of a step command, e.g., selecting the Incremental Trace command 306, as indicated by arrow 1008, which loops back on step 1006.

If sources are being traced, the path identification tool 730 may highlight the path through the currently presented hierarchical level as opened on the canvas 106 to the final sources of the currently presented hierarchical level, as indicated at step 1010. If the user selects incremental tracing for sources, e.g., selecting the Incremental Trace command 306, the path stepping tool 732 may highlight a previous connection element and/or model element from a current location along the path to the final sources, as indicated at step 1012. The process of sequentially highlighting a previous connection element and/or model element may be repeated in response to additional selections of a step command, e.g., selecting the Incremental Trace command 306, as indicated by arrow 1014, which loops back on step 1012.

Stepping up through a model's hierarchical levels may be continued until a model's root level is reached. In some embodiments, stepping up through a model's hierarchical levels may be continued until a particular type of component is reached. The particular type of component may be user specified. In some implementations, the path marking unit 714 may receive a criterion that indicates a component not to be opened, while stepping up through a model's hierarchical levels. Exemplary criteria include the top level of a nonvirtual subsystem, a conditionally executed subsystem, an atomic subsystem, a function-call subsystem, an atomic subchart, an AND substrate, an OR substrate, a masked subsystem, etc.

In some embodiments, a user may designate one or more model elements of a model and/or one or more model element types as either a source or a destination. For example, a model element may be provided with one or more properties, such as Set_as_Source and Set_as_Destination properties. For a given model element included in a model, a user may set either or both of the model element's Set_as_Source or Set_as_Destination properties as true. The path identification tool 730 may then treat the given model element as a source and/or destination. In addition, a model element may be provided with further properties, such as Set_Model_Element_Type_as_Source or Set_Model_Element_Type_as_Destination. If either or both of the Set_Model_Element_Type_as_Source or Set_Model_Element_Type_as_Destination is set to true for a given model element type, such as a Gain type, a Sum type, an Integrator type, etc., the path identification tool 730 may then treat all instances of the given model element type, e.g., all Gain blocks, all Sum blocks, all Integrator blocks, etc., as a source and/or a destination.

In some implementations, the path identification tool 730 may treat a component, such as a subsystem or a submodel, as a source if the component includes a source model element. Similarly, the path identification tool 730 may treat a component as a final destination if the component includes a destination model element.

Execution Aware (Dynamic Mode)

FIGS. 11A to 11E are partial views of a flow diagram of a method in accordance with an embodiment.

The structural analysis tool 726 may access a model, and analyze the model's connectivity structure, as indicated at step 1102. The structural analysis tool 726 may construct a graph, such as a directed graph, that represents the connectivity structure of the model, as indicated at step 1104.

As described, the model compiler 720 may compile the model, as indicated at step 1106. Compilation and linking of a model may involve allocating memory, preparing data structures, evaluating parameters, configuring and propagating block characteristics, determining block connectivity, and performing block reduction and block insertion. Additionally, one or more in memory representations, such as intermediate representations (IRs), may be generated for the model by the IR builder 724, as described.

The model compiler 720 may determine an execution order of the model elements included in a model, as indicated at step 1108. For example, the model compiler 720 may generate a sorted block list of the model elements included in a model. In some embodiments, equations may be associated with the model elements included in a model, and a sorted order of the equations corresponding to the model elements may be generated by the compiler 720 in addition to a block method execution list. The model compiler 720 may generate one or more data structures representing the model's execution order, as indicated at step 1110. The compiled and linked version of a model may be utilized by the interpreter 716 during model execution.

Figure 11A:
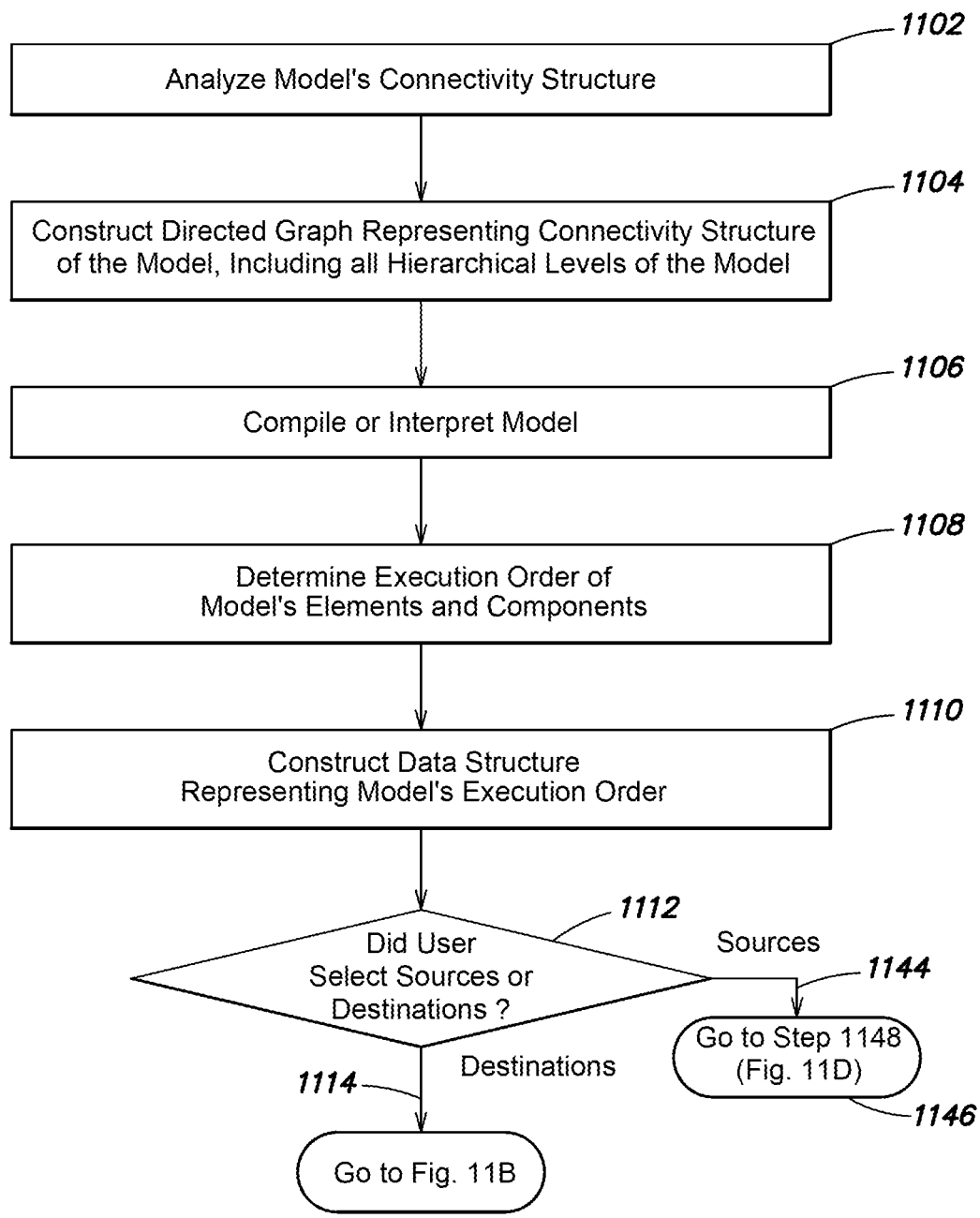
FIGS. 11A-11E are partial views of a flow diagram of a method in accordance with an embodiment.
Figure 11B:
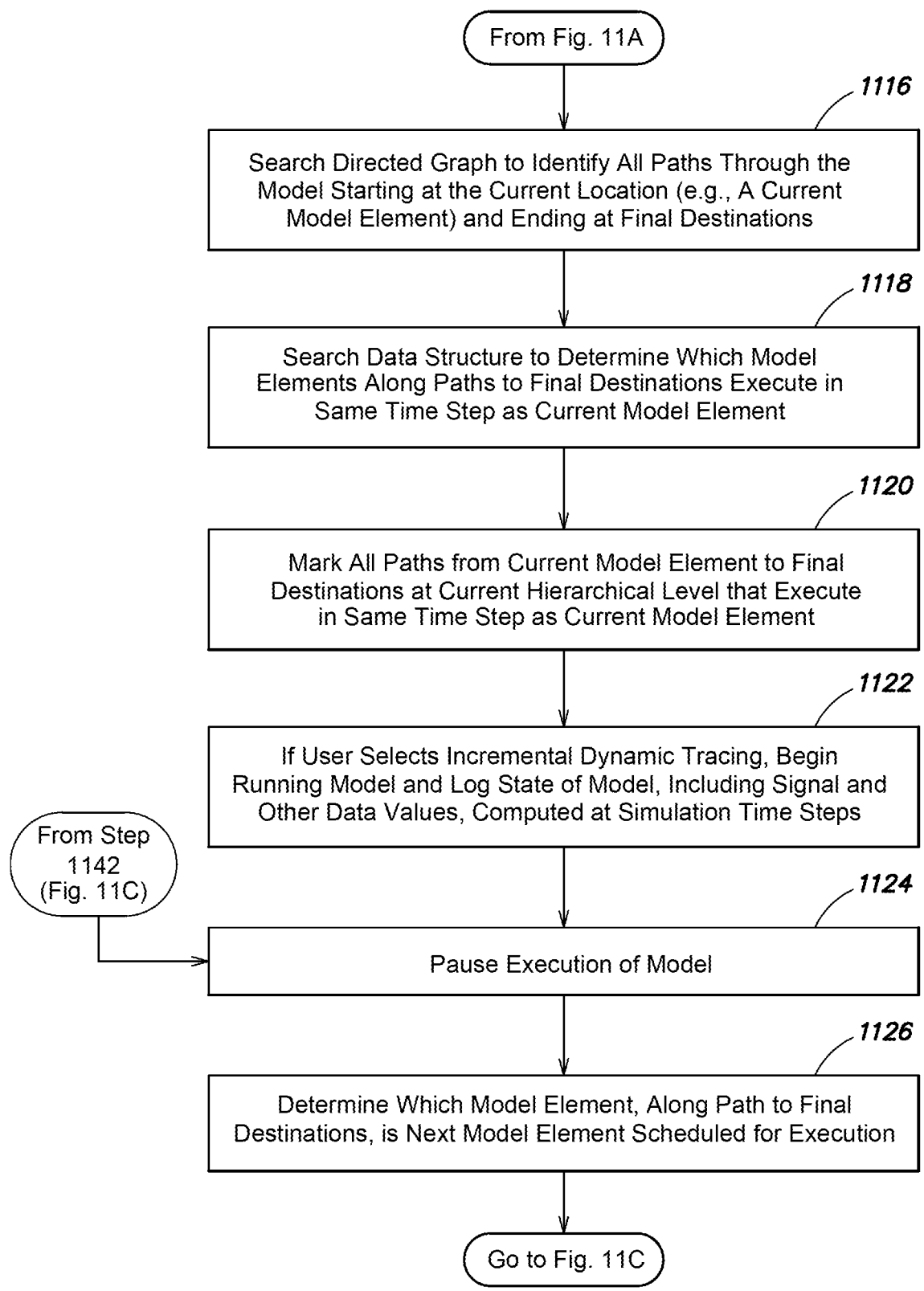
Figure 11C:
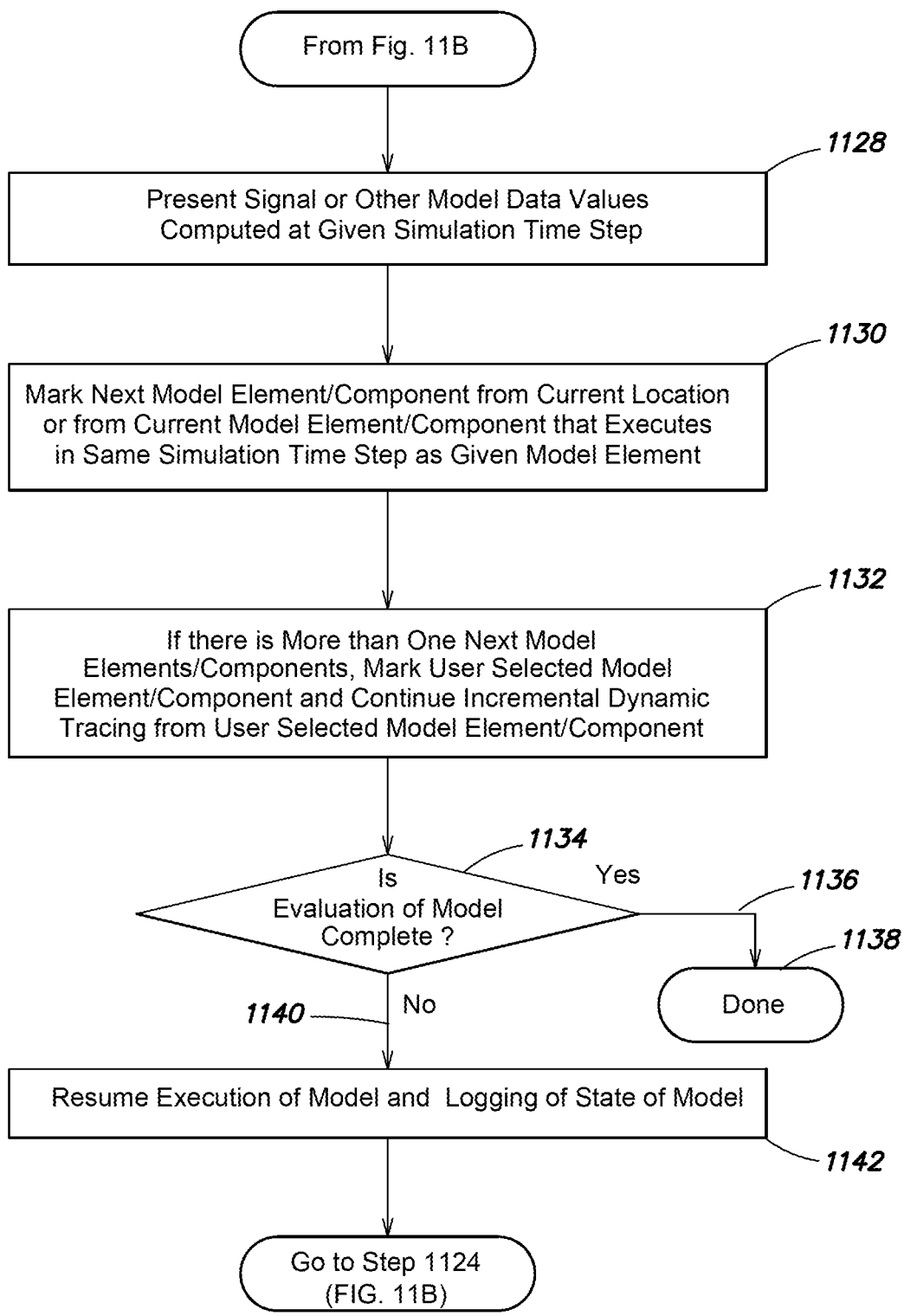

The path identification tool 730 may determine whether the user chose to see the paths to the final sources or the final destinations, as indicated at decision block 1112. If the user selected final destinations, the path identification tool 730 may search the graph, and identify all paths through the model starting at a given or current location in the model, e.g., a current model element, and leading to all final destinations, as indicated by arrow 1114 (labeled Destinations) leading to step 1116 (FIG. 11B). The dynamic analysis tool 728 may search the one or more data structures representing the model's execution order to determine which model elements along paths to the final destinations execute in the same time step as the current model element, as indicated at step 1118.

The path identification tool 730 may highlight the paths from the current location to the final destinations at the current hierarchical level that execute in the same time step on a visual presentation of the model, as indicated at step 1120. If the user selects dynamic incremental tracing, e.g., selecting the Incremental Trace command 306, the simulation engine 710 may commence execution of the model, and the dynamic analysis tool 728 may log the state of the model during execution, as indicated at step 1122. For example, the dynamic analysis tool 728 may log, e.g., store in one or more log files or other data structures, signal and other computed data values at one or more simulation time steps of the model. Execution of the model may be paused, as indicated at step 1124. Execution may be paused during a given simulation time step of the model. Furthermore, execution may be paused following the execution of a particular model element in the sorted block list.

The dynamic analysis tool 728 may determine which model element, along the path from the current location to the final destinations, is the next model element scheduled for execution after the particular model element, which was the last model element to execute before execution was paused, as indicated at step 1126. The path marking unit 714 may obtain and present one or more signal or other data values computed at the given simulation time step, as indicated at step 1128. For example, the path marking unit 714 may display on a visual representation of the model the signal or other data value output by the particular model element, which was the last model element to execute before execution was paused.

The path stepping tool 732 may highlight the next model element scheduled for execution after the particular model element, as indicated at step 1130. If there is more than one next model element or model connection along the path, the path stepping tool 732 may provide an indication of the next model elements to the user, and in response to receiving a selection from the user may highlight the selected model element or model component, as indicated at step 1132. In addition, further incremental stepping along the path may proceed from the user selected model element or model component, as also indicated at step 1132.

If the evaluation of the model is complete, processing may end as indicated by decision step 1134 and Yes arrow 1136 leading to Done step 1138. If evaluation of the model is to continue, the simulation engine 710 may resume execution of the model and the logging of data, as indicated by No arrow 1140 leading to step 1142. Processing may then return to step 1124 as indicated by Go To step 1144.

In some implementations, the simulation engine 710 may pause and resume execution of a model by executing the model step-by-step, e.g., in response to user selection of a step-forward command button or a step-backward command button. Each step may correspond to the execution of a next or a previous model element.

Figure 11D:
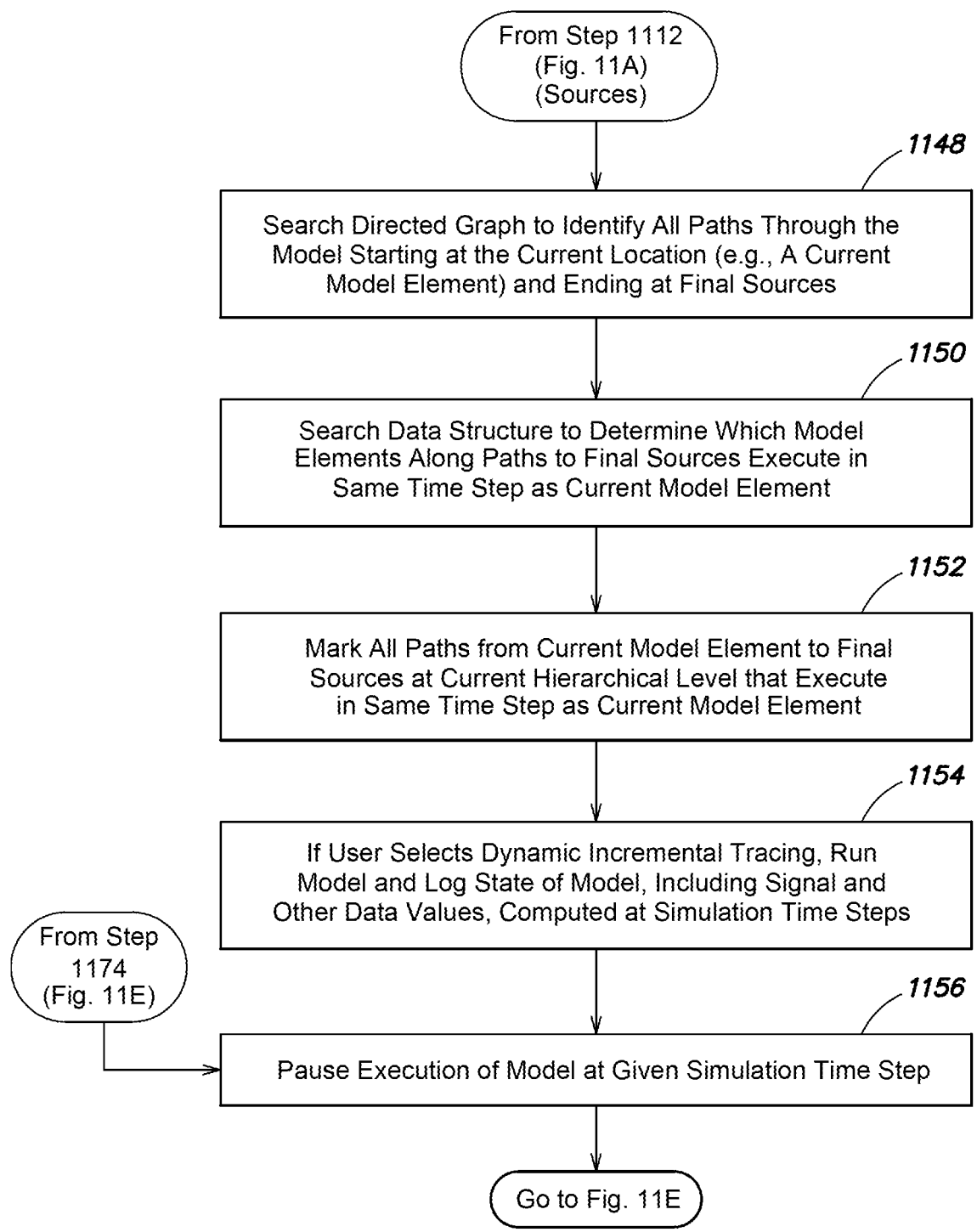

Returning to decision step 1112 (FIG. 11A) if the user selected sources, the path identification tool 730 may search the graph, and identify all paths through the model starting at a given or current location in the model, e.g., a current model element, and leading to all final sources, as indicated by arrow 1144 (labeled Sources) to Go To step 1146, which leads to step 1148 (FIG. 11D). The dynamic analysis tool 728 may search the one or more data structures representing the model's execution order to determine which model elements along paths to the final sources execute in the same time step as the current model element, as indicated at step 1150.

The path identification tool 730 may highlight the paths from the current location to the final sources at the current hierarchical level that execute in the same time step on a visual presentation of the model, as indicated at step 1152. If the user selects dynamic incremental tracing, e.g., selecting the Incremental Trace command 306, the simulation engine 710 may commence execution of the model, and the dynamic analysis tool 728 may log the state of the model during execution, as indicated at step 1154. Execution of the model may be paused, as indicated at step 1156. Execution may be paused during a given simulation time step of the model. Furthermore, execution may be paused following the execution of a particular model element in the sorted block list.

Figure 11E:
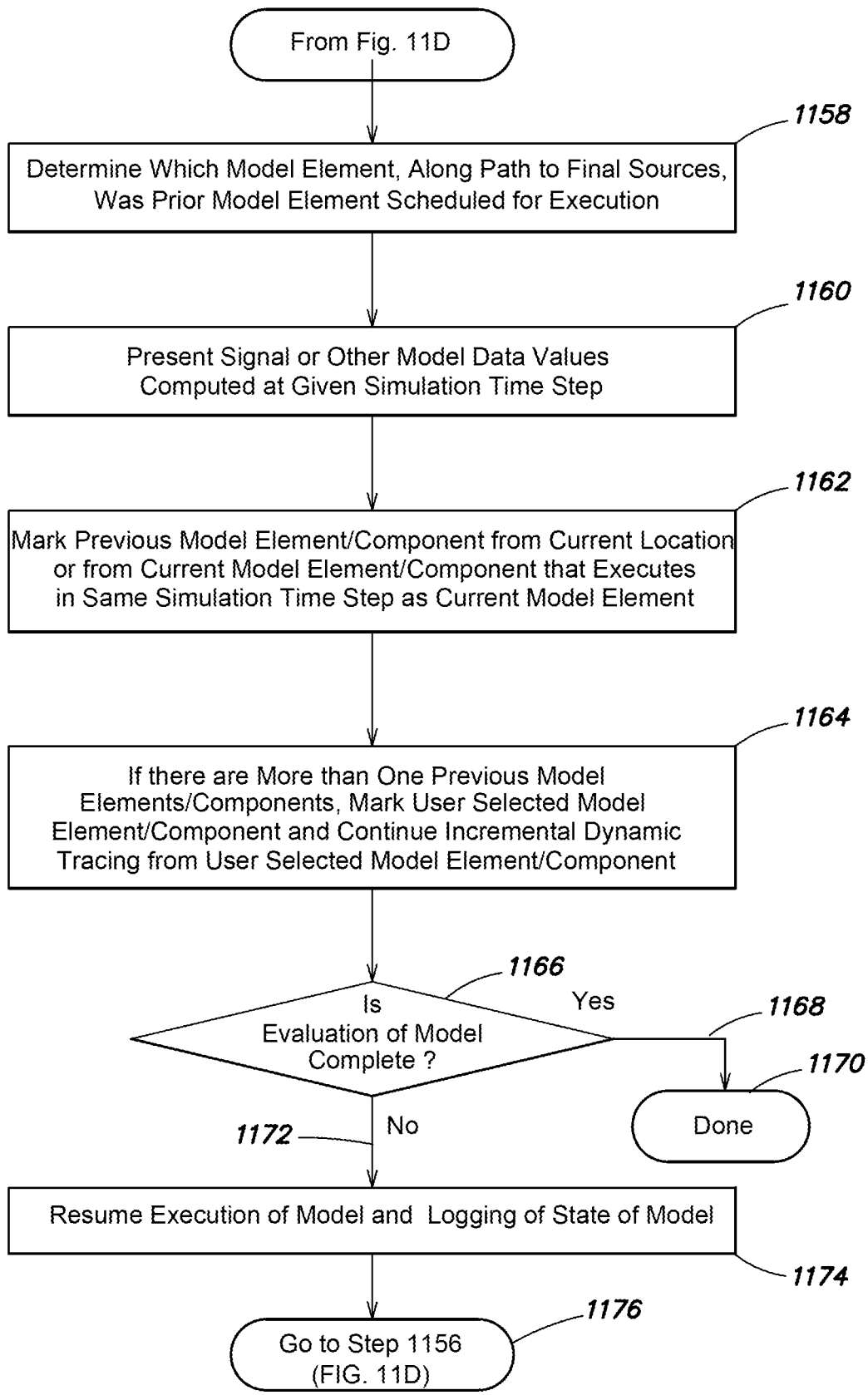

The dynamic analysis tool 728 may determine which model element, along the path from the current location to the final sources, was the prior model element scheduled for execution before the particular model element, which was the last model element to execute before execution was paused, as indicated at step 1158 (FIG. 11E). The path marking unit 714 may obtain and present one or more signal or other data values computed at the given simulation time step, as indicated at step 1160. For example, the path marking unit 714 may display on a visual representation of the model the signal or other data value output by the particular model element, which was the last model element to execute before execution was paused.

The path stepping tool 732 may highlight the previous model element scheduled for execution before the particular model element, as indicated at step 1162. If there is more than one previous model element or model connection along the path, the path stepping tool 732 may provide an indication of the next model elements to the user, and highlight the user selected model element or model component, as indicated at step 1164. In addition, further incremental stepping along the path may proceed from the user selected model element or model component, as also indicated at step 1164.

If the evaluation of the model is complete, processing may end as indicated by decision step 1166 and Yes arrow 1168 leading to Done step 1170. If evaluation of the model is to continue, the simulation engine 710 may resume execution of the model and the logging of data, as indicated by No arrow 1172 leading to step 1174. Processing may then return to step 1156 as indicated by Go To step 1176.

Figure 12:
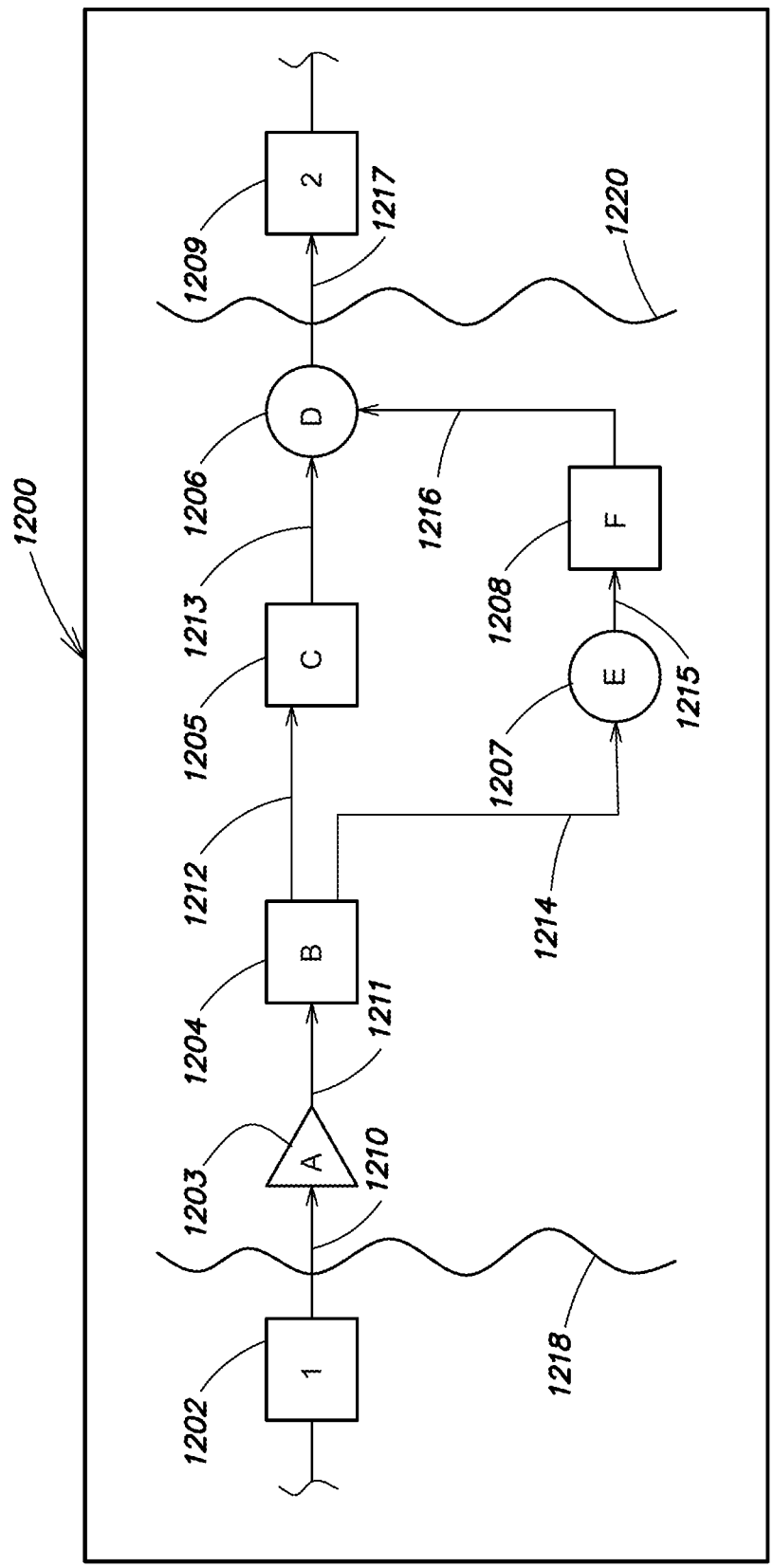
FIG. 12 is a schematic illustration of a portion of a model in accordance with an embodiment.

FIG. 12 is a schematic illustration of a portion of a model 1200 in accordance with an embodiment. The model portion 1200 may include a plurality of model elements 1202-1209, labeled 1, A, B, C, D, E, F, and 2. The model elements 1202-1209 may be interconnected by a plurality of connection elements 1210-1217. Suppose model elements 1203-1208 execute during a different simulation time step than model element 1202 and model element 1209 as indicated by dividing lines 1218 and 1220. It should be understood that the dividing lines 1218 and 1220 are for illustrative purposes only and may not be displayed with the model portion 1200.

The model compiler 720 may determine the following order of execution the model elements 1203-1208, which execute in one simulation time step:

A→B→C→E→F→D

Suppose a user selects model element 1204, and also enters or selects a command to view the model elements that execute during the same simulation time step as model element 1204 and that are destinations of model element 1204. In response, the dynamic analysis tool 728 and the path identification tool 730 may determine that model elements 1204-1208 are destinations of model element 1204 that execute in the same simulation time step as model element 1204. The path identification tool 730 may highlight model elements 1204-1208. The path identification tool 730 may select from a number of different search techniques to identify the model elements that execute in the same simulation time step as model element 1204, and that are destinations of model element 1204. For example, the path identification tool 730 may utilize a breadth first search (BFS) technique, a depth first search (DFS) technique, a linear search, or some combination thereof. As indicated by connection elements 1212 and 1214, model element 1204 (B) computes two output values. Applying a BFS technique, the path identification tool 730 may identify the destination model elements for the starting model element, e.g., model element 1204, as follows:

C, E, D, F Applying a DFS technique, the path identification tool 730 may identify the destination model elements for the starting model element, e.g., model element 1204, as follows:

C, D, E, F

Figure 13:
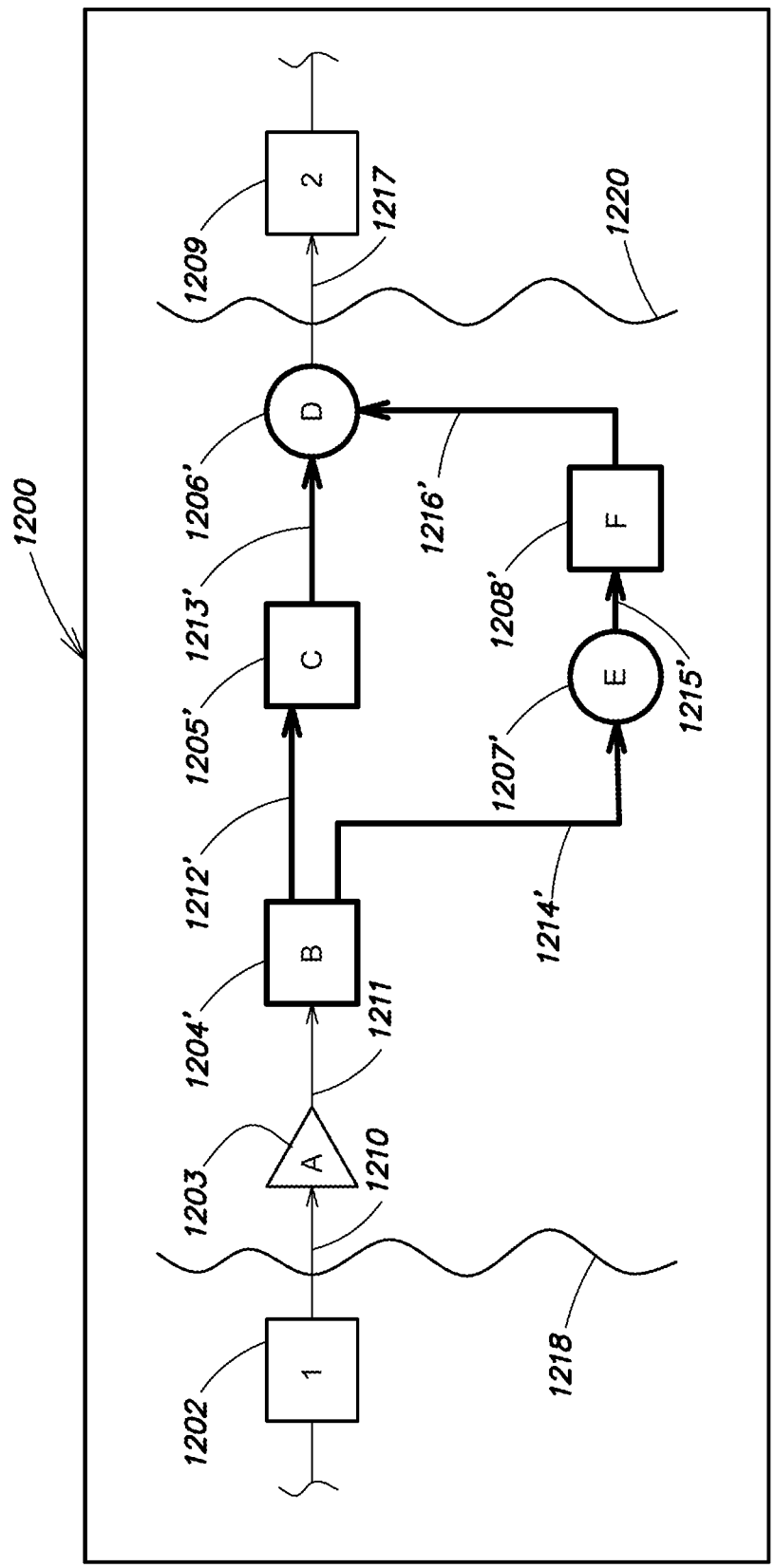
FIG. 13 is a schematic illustration of a portion of a model in accordance with an embodiment.

FIG. 13 is a schematic illustration of the model portion 1200. The path marking unit 714 may highlight those model elements along the paths from the starting location, e.g., model element 1204, that are destinations and that execute in the same simulation time step as model element 1204. For example, the path marking unit 714 may highlight model elements 1204-1208 as well as connection elements 1212-1216, which are labeled 1204'-1208' and 1212'-1216' in FIG. 13 to indicate that their appearance is changed relative to their original appearance as illustrated in FIG. 12. In an embodiment, the path marking unit 714 applies bolding. However, it should be understood that other highlighting techniques, such as color, shading, line style, line type, animation, lowlighting, etc. may be used. While model element 1209 may also be a destination of model element 1204, it may not be highlighted by the path marking unit 714 because it was determined not to execute in the same simulation time step as the identified model element, e.g., model element 1204.

Suppose a user selects model element 1204, and also enters or selects an incremental trace command, e.g., the Incremental Trace command button 306, to view the model elements that are destinations of the model element 1204. Suppose further that the user issues a request to view output values computed during execution of the model 1200. In some embodiments, the user may guide the path identification tool in the selection of the search technique. For example, from the starting model element, e.g., model element 1204, the user may direct the path marking unit 714 to utilize a BFS technique. In response, the path marking unit 714 may utilize the BFS technique, and identify model elements 1205 and 1207 as being the next model elements to execute following execution of model element 1204. In some embodiments, the path marking unit 714 may present one or more graphical affordances to the user identifying the paths leading to model elements 1205 and 1207. The user may select the path leading to model element 1207 for further incremental tracing.

Figure 14:
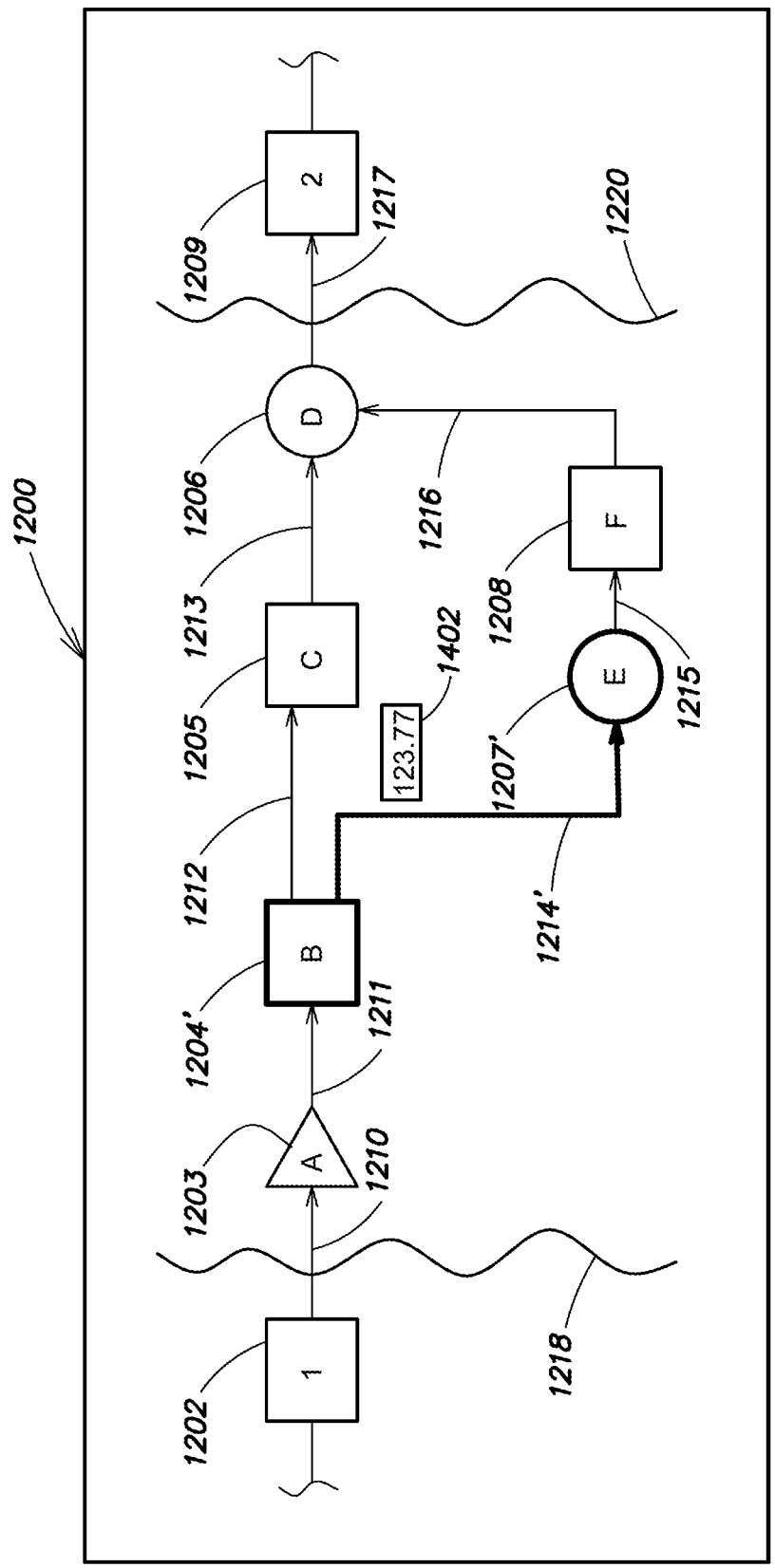
FIG. 14 is a schematic illustration of a portion of a model in accordance with an embodiment.

FIG. 14 is a schematic illustration of the model portion 1200. Based on the input from the user, the path marking unit 714 may highlight model element 1204, connection element 1214 and model element 1207, which are labeled 1204', 1214', and 1207' in FIG. 14 to indicate that their appearance is changed relative to their original appearance as illustrated in FIG. 12, e.g., by bolding. In addition, the path marking unit 714 may obtain one or more output values computed by model element 1204. The path marking unit 714 may obtain the one or more output values from the log. The path marking unit 714 may present the one or more output values on the presentation of the model 1200 on a canvas of a model editor window. In some embodiments, the path marking unit 714 may include one or more graphical affordances that indicate one or more output values computed by the starting location, e.g., model element 1204. For example, the path marking unit 714 may present a pop-up window 1402 that includes an output value computed by model element 1204, e.g., "123.77". The path marking unit 714 may locate the pop-up window 1402 in proximity to the output port of model element 1204 to which the computed value is written, e.g., the output port connected to connection element 1214.

Suppose the user wishes to continue stepping forward through the execution of the model 1200 from the execution point represented in FIG. 14. The user may select an incremental trace command, e.g., the Incremental Trace command button 306. The path marking unit 714 may determine that the next model element to execute after model element 1207 along the path selected by the user is model element 1208.

Figure 15:
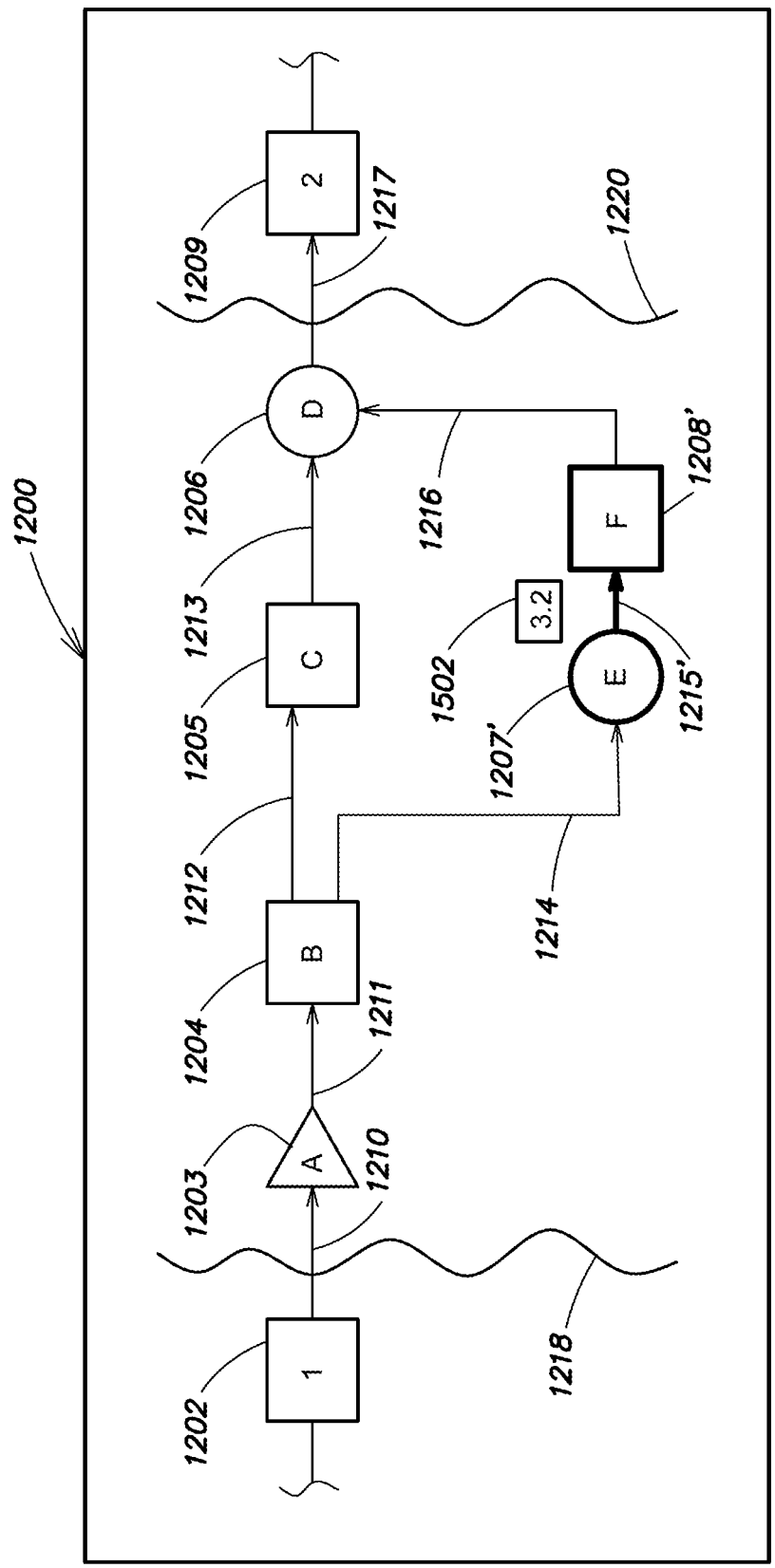
FIG. 15 is a schematic illustration of a portion of a model in accordance with an embodiment.

FIG. 15 is a schematic illustration of the model portion 1200. The path marking unit 714 may highlight model elements 1207 and 1208 and connection element 1215, which are labeled 1207', 1208', and 1215' in FIG. 15 to indicate that their appearance is changed relative to their original appearance as illustrated in FIG. 12, e.g., by bolding. The path marking unit 714 also may obtain one or more output values computed by model element 1207, and utilize one or more graphical affordances to present the one or more output values on the presentation of the model 1200. For example, the path marking unit 714 may present a pop-up window 1502 that includes an output value computed by model element 1207, e.g., "3.2". The path marking unit 714 may locate the pop-up window 1502 in proximity to the output port of model element 1207 to which the computed value is written, e.g., the output port connected to connection element 1215.

Suppose the user wishes to continue stepping forward through the execution of the model 1200 from the execution point represented in FIG. 15. The user may select an incremental trace command, e.g., the Incremental Trace command button 306. The path marking unit 714 may determine that the next model element to execute after model element 1208 along the path selected by the user is model element 1206.

Figure 16:
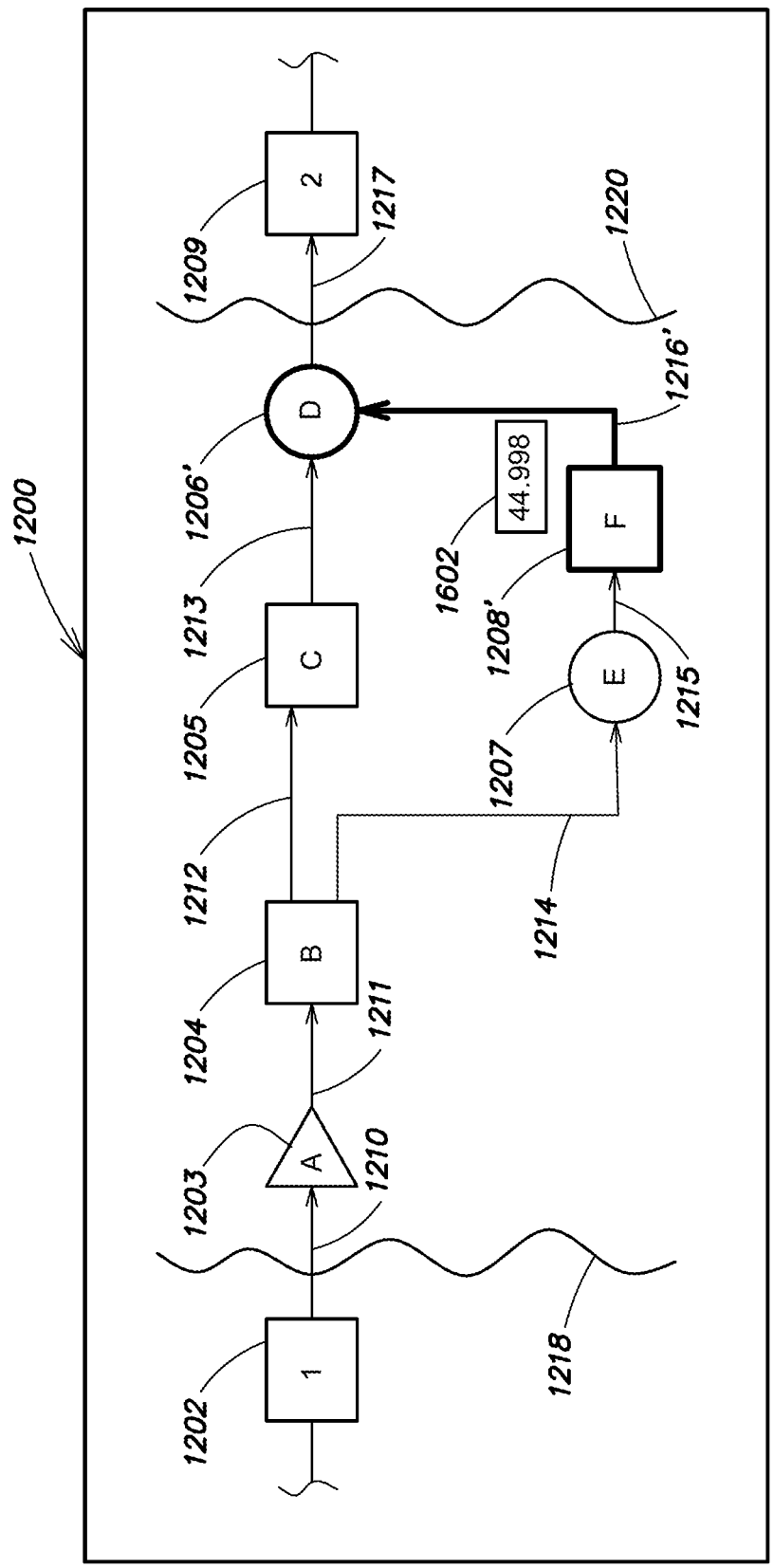
FIG. 16 is a schematic illustration of a portion of a model in accordance with an embodiment.

FIG. 16 is a schematic illustration of the model portion 1200. The path marking unit 714 may highlight model elements 1208 and 1206 and connection element 1216, which are labeled 1208', 1206', and 1216' in FIG. 16 to indicate that their appearance is changed relative to their original appearance as illustrated in FIG. 12, e.g., by bolding. The path marking unit 714 also may obtain one or more output values computed by model element 1208, and utilize one or more graphical affordances to present the one or more output values on the presentation of the model 1200. For example, the path marking unit 714 may present a pop-up window 1602 that includes an output value computed by model element 1208, e.g., "44.998". The path marking unit 714 may locate the pop-up window 1602 in proximity to the output port of model element 1208 to which the computed value is written, e.g., the output port connected to connection element 1216.

It should be understood that the user may continue to step through the execution of the model 1200. The path marking unit 714 may highlight the model elements and connections elements that are executed. The path marking unit 714 also may present graphical affordances that include output values computed by the model elements.

A user may choose to trace sources from a starting location, e.g., model element 1204. The path marking unit 714 may determine that model element 1203 is the model element that executes prior to execution of model element 1204. Accordingly, the path marking unit 714 may highlight the path from model element 1204 to model element 1203, e.g., by bolding model element 1204, connection element 1211, and model element 1203. The path marking unit 714 also may obtain one or more output values computed by the model element 1203, e.g., from the log, and present the one or more output values in a pop window or other graphical affordance.

A model may include a conditionally executed model component, such as a conditionally executed subsystem. If a conditionally model component is not activated for execution, it may not be highlighted by the path identification tool 730.

In some embodiments, commands to highlight paths may be specified textually, e.g., by a user. The commands may be entered into one or more CLIs. For example, the path marking unit 714 may be configured to respond to the following textual commands:

'Model.Structure.Graph.traceAllDst', which may command the path marking unit 714 to find all final destinations;

'Model.Structure.Graph.traceAllSrc', which may command the path marking unit 714 to find all final sources;

'forwardStepHighlight( )', which may command the path marking unit 714 to highlight one step at the current hierarchical level;

'forwardStepInHighlight( )', which may commend the path marking unit 714 to step down one level in the model hierarchy;

'forwardStepOutHighlight( )', which may command the path marking unit 714 to step up one level in the model hierarchy;

'fastforwarHighlight( )', which may command the path marking unit 714 to highlight the entire current path;

'backwardRemoveHighlight( )', which may command the path marking unit 714 to remove the highlighting one step back of a current location; and 'fastbackwardRemoveHighlight( )', which may command the path marking unit 714 to remove the highlighting of the entire current path.

The above textual commands are intended for illustration purposes only. It should be understood that additional and/or other textual commands may be defined.

Outside Connections

A model component, such as a subsystem, may include a first model element connected to an input to the subsystem, and a second model element connected to an output of the subsystem. The first and second model elements may not be connected to each other within the subsystem. However, at a higher hierarchical level, the output of the subsystem may be part of a path that traces back to the input of the subsystem. This subsystem may be stepped into while highlighting this path. In some embodiments, the path identification tool 730 may highlight both the first and the second model elements of the subsystem even though they are not connected to each other within the subsystem, because the first and second model elements are determined to be connected to each other from outside the subsystem, e.g., at a higher hierarchical level.

Model Slice Evaluation

In some embodiments, a model slice may be generated from a model. The model slice may include a subset of the model elements of the model.

A process may be performed to generate a model slice. The process may be carried out by the modeling environment 700 and/or a Technical Computing Environment (TCE) running on one or more data processing devices. The TCE may include hardware or a combination of hardware and software that provides a computing environment that allows users to perform tasks related to disciplines, such as, but not limited to, mathematics, science, engineering, medicine, business, etc., more efficiently than if the tasks were performed in another type of computing environment, such as an environment that required the user to develop code in a conventional programming language, such as C++, C, Fortran, Pascal, etc. In some implementations, the TCE may include a dynamically-typed programming language (e.g., the M language, a MATLAB® language, a MATLAB-compatible language, a MATLAB-like language, etc.) that can be used to express problems and/or solutions in mathematical notations.

The process may include obtaining a model. For example, a user of a data processing device may generate a 2D representation and/or a spatial representation associated with one or more physical elements of a system. The user may cause the model to be stored in a memory. The data processing device may obtain the model from the memory.

The process may include specifying a design interest for the model. For example, the model may include a group of model elements corresponding to the one or more physical elements of the system. A user may specify a design interest for generating a model slice of the model. The model slice may be a simplified model relative to the model, and may exhibit a same set of behaviors as the model under an assumption of the slicing criteria. The data processing device may receive information identifying the design interest from the user.

In some implementations, the data processing device may provide the model, including the group of model elements, for display, via a user interface. The user may be interested in an operation of a particular model element included in the group of model elements. The user may interact with the user interface to designate the particular model element as a design interest for the model.

In some implementations, the design interest may include one or more constraints related to evaluating the model, such as, for example, performing a formal static analysis on the model. The constraint may limit or constrain an execution of the model and/or a performance of the formal static analysis. For example, the constraint may identify a time period during which the model is to be evaluated (e.g., the first 3 seconds, the last 5 seconds, from t=1 to t=5, a first time a model element is in a particular state until the model element leaves the particular state, a first time interval during which a particular signal (e.g. an enable signal) corresponds to true, etc.), constrain one or more inputs of the model (e.g., set an input to a particular value, limit the input to a particular range of values, etc.), constrain one or more outputs of the model, require a state of one or more model elements included in the model to remain constant, etc.

In some implementations, the design interest may identify a scope of analysis associated with evaluating the model. The scope of analysis may define a domain of interest associated with the design interest (e.g., a particular model element). For example, the design interest may identify a set of signals input to the model, a set of signals output by the model, a subsystem or a sub-model included in the model, a state of the model, a state event, a data store memory, a set of all zero-crossing events of a hybrid system model, etc.

In some implementations, the domain of interest may be defined as including model elements that contribute to overall dynamics of the model, model elements that do not contribute to the overall dynamics of the model, and/or signals of the model that are active under a particular constraint.

In some implementations, the domain of interest may be defined in terms of a subsystem and/or a sub-model of the model. For example, the design interest may indicate that all of the model elements included in a particular subsystem of the model are to be excluded from the evaluation of the model. In some implementations, the scope of analysis may indicate that the model is to be evaluated upstream and/or downstream with respect to a set of constraints.

In some implementations, information identifying one or more portions of the design interest may be provided via a user interface.

The process may include evaluating the model based on the design interest. For example, the data processing device (e.g., the modeling environment 700 and/or the TCE) may obtain the design interest and may identify a particular model element, a constraint, and/or a scope of analysis associated with evaluating the model. The data processing device may evaluate the model by performing one or more different types of analysis of the model. In some implementations, the analysis may include a dependence analysis that determines a dependence between model elements. The dependence analysis may be based on the execution activities of the model elements. For example, a formal static analysis or a dynamic analysis may determine that a model element is in a particular state. The dependence analysis may analyze the model with the model element being held in the particular state.

In some implementations, the analysis of the model may include a dynamic analysis the model. The dynamic analysis may analyze dynamics of the model. The data processing device may determine execution activities of the model elements based on the analysis. For example, the design interest may include a constraint that identifies a particular period of time (e.g., a first 3 seconds of an execution of the model, the last 5 seconds of an execution of the model, from t=1 to t=5 during an execution of the model, from a first time a model element is in a particular state until a time when the model element leaves the particular state, a time interval during which a particular signal (e.g. an enable signal) first corresponds to true, etc.). The data processing device may execute the model and may collect coverage information for the model during the particular period of time. The data processing device may determine a group of model elements that are in an active state and/or are required for evaluating the operation of the particular model element based on the coverage information.

In some implementations, the coverage information may include code coverage information. For example, each model element in the model may correspond to one or more code segments for executing the model element. The data processing device may assemble the one or more code segments for each model element in an arrangement to allow the model to be executed. The data processing device may execute the model based on the assembled arrangement of the one or more code segments. During the execution, the data processing device may determine whether a code segment has executed at least once during the particular period of time. The data processing device may determine that a model element is in an active state during the particular period of time when a code segment associated with the model element is executed at least once during the particular period of time.

In some implementations, the coverage information may include model coverage information. For example, the data processing device may execute the model using test cases that were determined based the one or more constraints and/or the one or more scopes of analysis. For example, the design interest may identify a set of input values that may be received by the model during a particular period of time. The data processing device may determine a test case based on the model receiving the set of input values during the particular period of time. The data processing device may use the test case during execution of the model and may collect model coverage information during the particular period of time.

In some implementations, the model coverage information may include one or more input values, one or more output values, one or more state charts, etc. resulting from the model receiving the set of input values during the particular period of time and generating output values based on the set of input values. The data processing device may determine that a model element is in an active state during the particular period of time based on an input value, an output value, a state chart, etc. collected for the model element. For example, the data processing device may determine that a value of the output for the model element is greater than zero. The data processing device may determine that the model element is in the active state based on the value of the output being greater than zero.

Additionally, or alternatively, the data processing device may perform a formal static analysis of the model. In some implementations, in those instances where the data processing device performs the dynamic analysis of the model, it may perform the formal static analysis of the model prior to performing the dynamic analysis of the model or after performing the dynamic analysis of the model. Thus, the data processing device may perform a dynamic analysis of the model, a formal static analysis of the model, a dynamic analysis followed by a formal static analysis of the model, or a formal static analysis followed by a dynamic analysis of the model.

In some implementations, in those instances when the formal static analysis is to be performed, the data processing device may perform the formal static analysis using formal methods, such as, for example, model checking and/or abstract interpretation. In some implementations, the data processing device may determine, based on the design interest, one or more constraints on a state of the model, one or more constraints on an input received by the model, and/or one or more scopes of analysis related to the formal static analysis. The data processing device may perform the formal static analysis based on the one or more constraints on the state of the model, the one or more constraints on the input, and/or the one or more scopes of analysis. In some implementations, the one or more constraints on the state of the model, the one or more constraints on the input, and/or the one or more scopes of analysis may correspond to one or more test cases for analyzing a particular behavior of the model.

In some implementations, the design interest may identify a state value constraint. The state value constraint may identify one or more elements of the model that are to be held in a particular state (e.g., active or inactive). For example, the model may include a group of model elements corresponding to a transmission system of a vehicle. The state value constraint may specify that the transmission system is to be in a particular gear (e.g., third gear). The data processing device may perform the formal static analysis of the model with the transmission system (e.g., the group of model elements) held in the particular gear.

In some implementations, the design interest may identify a signal value constraint. The signal value constraint may identify one or more input values and/or one or more output values to be applied to an input and/or an output of one or more model elements. For example, the design interest may include a constraint that specifies that an output of a model element is set to a particular value. The data processing device may set the output of the model element to the particular value and may perform the formal static analysis of the model.

As an example, assume that the model includes a logic block and that an output of the logic block may be a signal corresponding to True or a signal corresponding to False. The constraint may require that the output of the logic block be set to the signal corresponding to True during the execution of the model. The data processing device may set the output of the logic block to output the signal corresponding to True and may perform the formal static analysis of the model.

In some implementations, the design interest may identify a frequency constraint. The frequency constraint may specify a frequency of one or more input values and/or one or more output values to be applied to an input and/or an output of one or more model elements. For example, the design interest may include a constraint that specifies that an input signal received by a model element is a sinusoidal signal with a frequency of 20 Hz, a sinusoidal signal with a frequency of less than 10 kHz, etc. The data processing device may set the input signal based on the frequency constraint and may perform the formal static analysis of the model.

In some implementations, the formal static analysis may include compiling one or more portions of the model and/or generating one or more in-memory representations of the model. For example, an intermediate representation (IR) generator, such as the IR builder 724, may generate one or more intermediate representations (IRs) associated with the model. In some implementations, the IR builder 724 may generate an IR of the model and/or an IR of the one or more constraints. For example, the IR builder 724 device may generate an IR for the model that includes a group of nodes connected by one or more edges. The group of nodes may represent model elements included in the model. The one or more edges may represent one or more connections between the model elements in the model.

The data processing device may analyze one or more decision points of the model (e.g., whether a switch block causes a signal to be passed to one portion of the model or to another portion of the model) based on the IR of the model. The data processing device may identify the group of model elements that are in an active state and/or are required for evaluating the operation of the particular model element based on analyzing the decision points.

In some implementations, the data processing device may evaluate the decision points by following a flow of data backwards through the model to determine data dependencies between model elements included in the model and/or by propagating a signal value forward through the model. For example, the design interest may include a first signal value constraint that sets a value of an output included in the model to a first value and a second signal value constraint that sets a value of an input to a second value.

In some implementations, the data processing device may follow the flow of data backwards through the model by setting the output to the first value and identifying a model element connected to the output. The data processing device may determine a data dependency between the output and the model element based on the model element being connected to the output. The data processing device may continue to follow a flow of data backwards through the model in a similar manner.

In some implementations, the data processing device may propagate the first value forward through the model by setting the input to the second value. For example, the data processing device may determine that the input provides an input to a switch block included in the model. The switch block may provide a received input to a first model element when the received input is within a particular range of values and may provide the input to a second model element when the received input is not within the particular range of values.

By way of example, assume that the data processing device determines that the received input is within the range of values when the input is set to the second value. The data processing device may determine that the switch block provides the received input to the first model element based on the received input being within the particular range of values. The data processing device may determine that the first model element is in an active state and/or that the second model element is in an inactive state when the received input is within the range of values. The data processing device may follow the flow of data forward through the model in a similar manner to identify model elements that are in an active state when the received input is within the range of values.

In some implementations, an IR of the model may include a design verifier intermediate representation (DVIR) and data structures used to determine dependencies of model elements. In some implementations, conditional regions in the model (e.g., an IF block, a switch, etc.) may be instrumented with check expressions. In some implementations, constraints included in the design interest may be incorporated as algebraic constraints of a state of the model and/or as input variables. The DVIR may then be analyzed to determine execution activities of regions and/or model elements of the model.

The process may include determining a group of model elements relating to the design interest and generating a model slice based on the group of model elements and/or outputting a result identifying the group of model elements. For example, the data processing device (e.g., the modeling environment 700 and/or the TCE) may determine an execution status (e.g., enabled, disabled, triggered, not triggered, active, inactive, etc.) of the model elements included in the model. The data processing device may identify one or more model elements that have an active status (e.g., enabled, triggered, active, etc.) when the model is evaluated with respect to the design interest. The data processing device may generate the model slice based on the one or more model elements having the active status and/or may output a result identifying the one or more model elements having the active status.

In some implementations, the design interest may identify a set of signals associated with the scope of analysis. The data processing device may identify one or more model elements that do not depend on the set of signals (e.g., one or more model elements that are inactive, disabled, not triggered, etc.). The data processing device may determine that the identified one or more model elements are not related to the design interest and/or that a set of other model elements (e.g., model elements that depend on the set of signals) are related to the design interest. The data processing device may generate the model slice based on the set of other model elements and/or may output a result identifying the set of other model elements.

In some implementations, the data processing device may determine the group of model elements based on code coverage information. For example, the data processing device may obtain code coverage information associated with performing the coverage analysis of the code generated for the model. The data processing device may analyze the code coverage information to identify one or more code segments that executed at least once during the coverage analysis. The one or more code segments may implement one or more model elements included in the model. The data processing device may determine that the one or more model elements were in an active state based on the one or more code segments executing at least once during the coverage analysis and, therefore, that the one or more model elements are related to the design interest. The data processing device may generate the model slice based on the one or more model elements being in the active state and/or may output a result identifying the one or more model elements in the active state.

In some implementations, the data processing device may determine the group of model elements based on model coverage information. For example, the data processing device may obtain model coverage information determined based on executing the model. The model coverage information may include information relating to signals received and/or output by one or more model elements included in the model. For example, the model may include a switch block that provides an output to a first portion of the model when an input to the switch block is less than a particular value and provides an output to a second portion of the model when the input is greater than or equal to the particular value. Based on the model coverage information, the data processing device may determine that, during the particular time period, the input to the switch block is always greater than the particular value. The data processing device may determine that the model elements included in the second portion of the model are in an active state during the particular time period and/or that model elements in the first portion of the model are not in an active state during the particular time period. The data processing device may determine that the model elements in the second portion of the model are related to the design interest based on the model elements being in the active state during the particular time period. The data processing device may generate the model slice based on the model elements in the second portion of the model and/or may output a result identifying the model elements in the second portion of the model.

In some implementations, the data processing device may determine the group of model elements related to the design interest based on performing the formal static analysis of the model. For example, the data processing device may obtain a result of performing the formal static analysis of the model based on the one or more constraints. The result may include information identifying a group of model elements that are in an active state based on applying the one or more constraints to the model. The data processing device may determine that the group of model elements in the active state are related to the design interest. The data processing device may generate the model slice based on the group of model elements being in the active state and/or may output a result identifying the group of model elements in the active state.

The data processing device may define an execution graph for the model as EG=(S∪P, E) where V=S∪P is a set of vertices and another set of vertices partitioned as a set of signal vertices S and a set of procedure vertices P, and E⊆V×V is a set of edges. In some implementations, the procedures in the execution graph correspond to blocks of statements. The execution graph may be a hybrid directed graph that captures both variable dependence and procedure dependence. For example, for the execution graph EG=(V, E) and a vertex v, the data processing device may define a vertex elimination graph as:

$$EG \backslash v = (V \backslash v, E \cup \{(x,y)|x \to v \text{ and } v \to y\}\{(x,v)|x \to v\} | \{(v,y)|v \to y\}),$$

where \ is the standard set difference operation for the set of vertices and edges. In some implementations, the data processing device may determine a relationship between execution context of non-virtual subsystems included in the model. In some implementations, the data processing device may determine the execution context based on an execution tree (e.g., a program structure tree). The data processing device may determine that an execution tree T=(V, E) is an undirected graph that is a rooted tree based on the execution tree satisfying certain criteria, such as, for example, T is connected, T has no cycles, and T has a unique node r called the root.

In some implementations, the data processing device may determine that a dynamic analysis structure for the execution tree is a four-tuple (EG, T, f) with an execution graph $EG=S_g \cup P_g, E_g$), an execution tree $T=(V_T, E_T)$, and two maps that associate the graph procedure vertices with tree nodes: $f:P_g \rightarrow V_T$ may associate an execution tree node with every procedure node in the execution graph; and $f^{-1}:V_T \rightarrow P_g \cup p_0$ may associate a procedure in the execution graph with a node in the execution tree. For tree nodes that do not have an associated procedure vertex, the data processing device may map the tree node to a special vertex $p_0$.

In some implementations, the model may be associated with a conditional execution context (CEC) tree (e.g., a unique rooted execution tree). Every leaf node in the CEC tree may be associated with a non-virtual model element of the model and every non-leaf node in the CEC tree may be associated with a non-virtual subsystem in the model. For a non-virtual model element, the maps f(v) and $f^{-1}$(t) may associate the execution graph node with an execution tree node that correspond to that non-virtual model element.

In some implementations, the model may be associated with a program structure tree (PST). The leaf nodes in the PST may be basic regions in the model and the non-leaf nodes may be other regions in the model. Each region may have an associated tree node in the execution tree. Each basic region may have an associated vertex in the execution graph. The map f(v) may associate the vertex in the execution graph with a corresponding node in the execution tree. The map $f^{-1}$(v) may map all tree nodes of the basic regions with a corresponding vertex in the execution graph and may map all tree nodes of the other regions to vo.

In some implementations, the data processing device may determine that a rooted tree imposes a partial order on the nodes in the execution tree. A node u is less than, or equal to Tv if, and only if, the unique path from the root to v passes through u. The data processing device may determine that the node u dominates v if u is less than, or equal to Tv. The dominance relationship of the CEC tree may determine execution activities of procedures of non-virtual model elements included in the model. For example, if a subsystem associated with a non-leaf node u is disabled, the data processing device may determine that all procedures associated with descendant nodes of the non-leaf node u are disabled. In these instances, the data processing device may determine that the data dependency at the inactive procedures are also inactive and may use a disabled value of the subsystem instead of an output value of the subsystem (e.g., a result corresponding to the inactive model elements being disconnected from an output signal of the inactive model elements in the execution graph). The data processing device may determine an active set of model elements and a dependent set of model elements based on the execution tree and/or the execution graph for the model and may implement a mapping of a simulation state for the model as a straightforward projection of a complete simulation state of the model to simulation states of the active and dependent model elements.

In some implementations, because a simulation state is dependent upon execution, a variable that is a simulation state variable in the model may become a non-state variable in the model slice. For example, the data processing device may determine that a subsystem in the model is disabled. The data processing device may determine that an output value for the subsystem is a constant value based on the subsystem being disabled. The data processing device may remove the subsystem when generating the model slice and may replace a signal output of the subsystem with a constant block having a value that is set at an initial output of the subsystem.

In some implementations, the data processing device may generate a model slice that, when executed, may cause the particular model elements identified in the design interest to exhibit a same behavior as exhibited by the particular model elements during an execution of the model (e.g., the model slice may approximate simulation semantics of the model with respect to the design interest).

In some implementations, the data processing device may determine a set of model transformation rules for generating the model slice. The data processing device may perform graphical transformations on the model to generate the model slice. In some implementations, the transformation rules may provide analysis for performing coverage-based model slicing. For example, a pre-dependence analysis may include parsing coverage data determined by performing a dynamic analysis of the model and extracting information regarding execution activities of the model elements. The information regarding the execution activities may be used in the dependence analysis of the model.

In some implementations, the transformation rules may incorporate semantic information, such as, for example, model coverage data, into the analysis and/or transformation of the model. Table 1, below, provides example methods that may be used by the data processing device to generate the model slice.

TABLE 1

| Method | Description |
| --- | --- |
| Applicable | Analyze an execution graph connection pattern of an execution graph generated for the model. Determine whether a transformation rule applies based on analyzing the execution graph connection pattern. |
| Analyze | Perform a pre-dependence analysis. Extract activity data from coverage information determined for the model. Determine active and/or inactive model elements based on the coverage information. |
| PostTransform | Perform a post-dependence analysis. Use dependence information to analyze the model. Determine graphical transformation actions for transforming one or more model elements based on the analysis. |
| Transform | Perform the determined graphical transformation actions on the model to generate the model slice. |

Referring to Table 1, the method Applicable may perform an analysis loop over non-virtual model elements included in the model and may determine whether a transformation rule is applicable with respect to each of the non-virtual elements. When the transformation rule is applicable, the method Applicable may invoke the method Analyze.

The method Analyze may analyze the coverage data and may extract information associated with an execution activity for the model. Applicable model elements may be analyzed based on the transformation rules. The analysis may be local. For example, for a model element that controls an execution of other model elements, the analysis may only return execution activity information associated with execution contexts controlled by the model element. The execution activity information may not propagate to execution contexts that are descendants of the execution context. As an example, assume that a subsystem of the model is determined to be inactive. Each child subsystem within the subsystem may be determined to be inactive.

The PostTransform method may analyze post-compile virtual model elements, such as, for example, a Merge block, a Concatenate block, etc., included in the model. The post-compile virtual model elements may be model elements that do not have associated execution procedures. The post-compile virtual model elements may define signal buffers that are shared among signal resources of the model elements. The data processing device may perform a localized analysis using a result of the dependency analysis to determine whether only one of the signal resources of the model element is active. When only one of the signal resources is active, the data processing device may determine that data sharing is not required and may remove the post-compile virtual block from the model. The data processing device may directly connect the active signal resource and a signal destination of the active signal resource based on removing the post-compile virtual block from the model.

Table 2, below, provides an example set of transformation rules that may be used by the data processing device to perform graphical transformations on the model.

TABLE 2

| Rule | Condition | Transformation |
| --- | --- | --- |
| Inactive-if | A branch of an If block is never taken | Remove a subsystem connected to the inactive branch of the If block |
| Redundant-if | A branch of an If block is always taken | Remove the If block and remove the If port of the subsystem |
| Inactive-switch | A branch of a Switch block is never active | Disconnect the inactive branch of the Switch block |
| Redundant-switch | One input of a Switch block is always taken | Remove the Switch block and connect an input of the Switch block to an output of the Switch block |
| Redundant-merge | One of the data sources of a Merge block is active (post-dependence analysis) | Remove the Merge block and connect an input of the Merge block to an output of the Merge block |
| Inactive-enable | Enable signal is never true | Remove a subsystem associated with the enable port |
| Inactive-trigger | Trigger signal is never active | Remove a subsystem associated with the trigger port |

In some implementations, the model slice may include all of the model elements included in the group of model elements related to the design interest. For example, the data processing device may identify model elements included in the model that are not included in the group of model elements. The data processing device may remove the identified model elements from the model to generate the model slice.

In some implementations, the model slice may include a portion of the group of model elements, one or more additional model elements, and/or one or more different model elements. For example, the group of model elements may include a signal block that selectively provides an input to a first portion of the model or a second portion of the model. The data processing device may determine that only the first portion of the model is not included in the group of model elements related to the design interest. The data processing device may remove the signal block (e.g., replace the signal block with a signal line for providing the input to the first portion of the model) to generate the model slice based on only the first portion of the model being included in the group of model elements.

In some implementations, the data processing device may store information related to generating the model slice. The stored information may allow the data processing device to re-create the group of model elements related to the design interest, generate a related model slice based on changes to the design interest provided by the user, undo an action taken in response to an input received by a user (e.g., the user inadvertently provides an input to perform an action with respect to generating the model slice and wants to undo it), and/or re-create the original model for the system. The data processing device may store information identifying each action performed when generating the model slice. The stored information may allow the data processing device to work backwards to undo one or more actions performed when generating the model slice. For example, the data processing device may store information identifying one or more model elements that are modified and/or removed from the group of model elements when generating the model slice.

In some implementations, the data processing device may provide information identifying differences between the model slice and the model. For example, the data processing device may provide a user interface that allows the user to view a list of model elements included in the model and/or a list of model elements included in the model slice. In some implementations, the user interface may display the list of model elements included in the model in conjunction with the list of model elements included in the model slice.

In some implementations, the user interface may list model elements, included in the group of model elements related to the design interest, that have been modified and/or are not included in the model slice and/or one or more additional model elements that are included in the model slice and are not included in the group of model elements and/or the model. For example, when generating the model slice, the data processing device may replace a switch block with a signal line. The user interface may provide a list that identifies the switch block as being included in the group of model elements, as not being included in the model slice, and/or as being replaced by the signal line.

Figure 19:
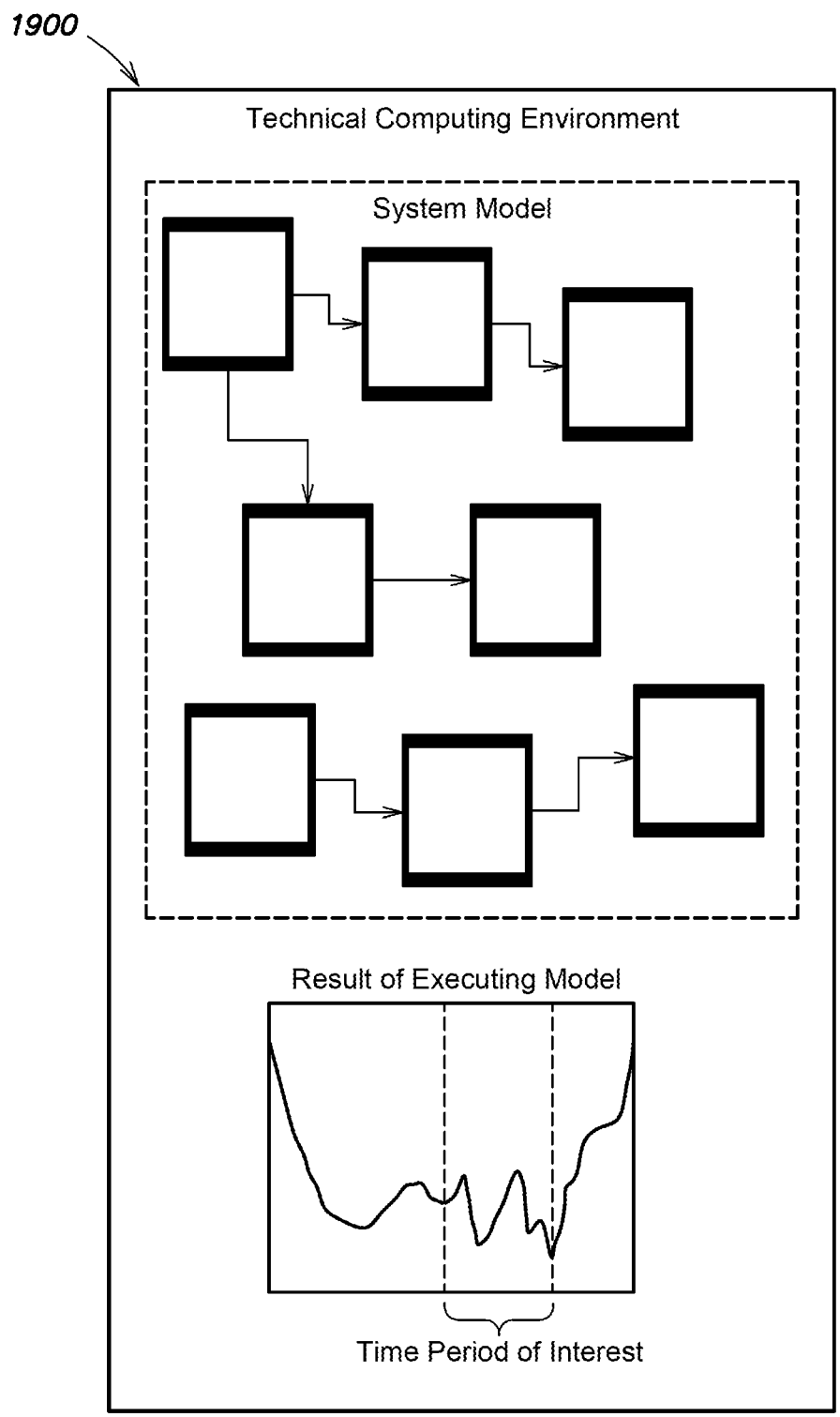
FIG. 19 is a diagram illustrating an example of a system model in accordance with an embodiment.
Figure 20:
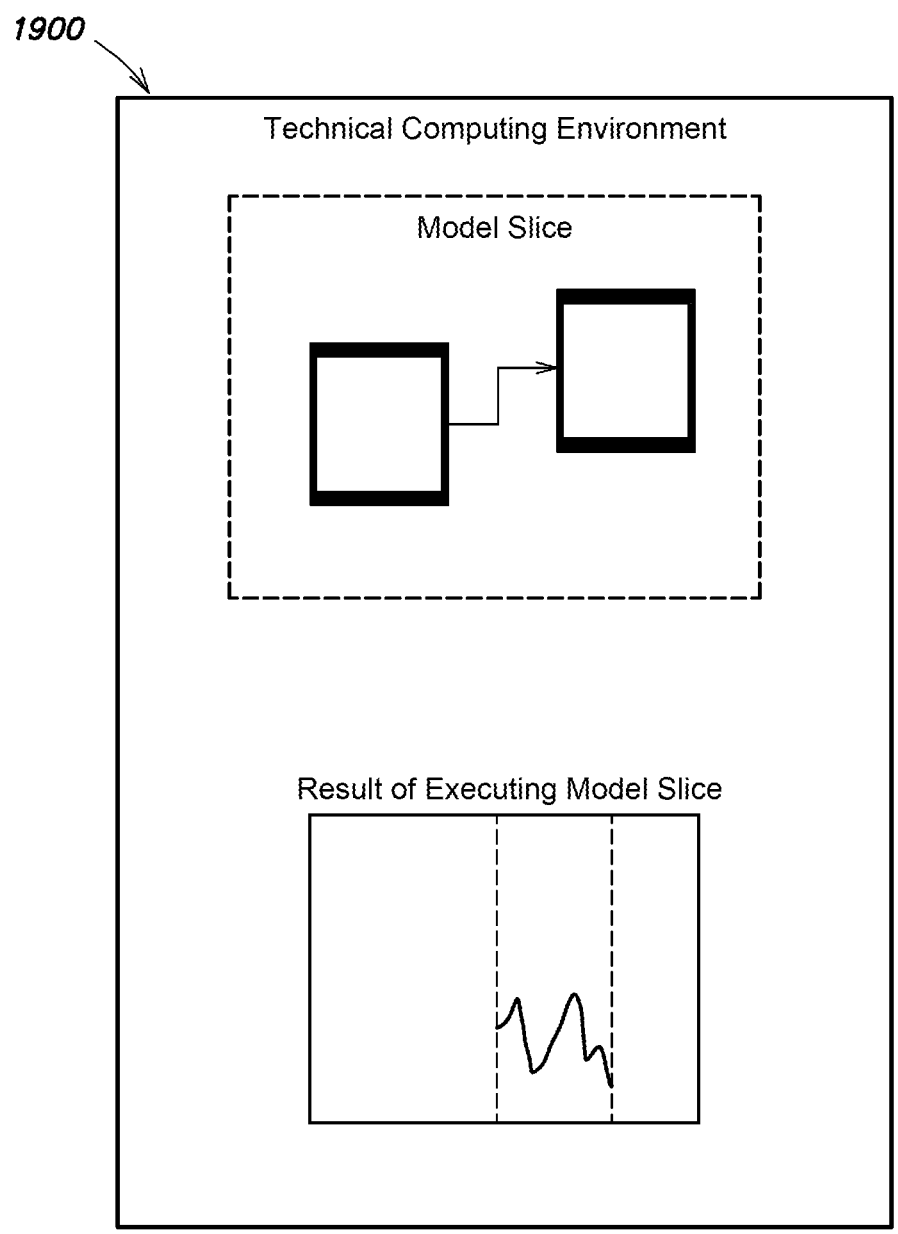
FIG. 20 is a diagram illustrating an example of a model slice of the system model of FIG. 19.

FIGS. 19 and 20 are diagrams illustrating an overview 1900 of an example implementation. For overview 1900, assume that a user generates a model of a physical system ("System Model") and simulates the behavior of the system by executing the model in the modeling environment 700 and/or TCE. Further, assume that the modeling environment 700 and/or the TCE provides, for display, a representation of the model along with a result of executing the model. Further, assume that, based on the result, the user has determined that the system model exhibits an undesired behavior for a specific simulation scenario during a particular period of time. Further, assume that the user has indicated that the user is interested in a behavior of the model during the particular period of time. As shown in FIG. 19, the modeling environment 700 and/or the TCE may display lines across a signal output by the model. The displayed lines may correspond to the particular period of time indicated by the user.

Referring now to FIG. 20, the modeling environment 700 and/or the TCE may determine model elements that are active during the particular period of time and may generate a model slice for the model. The model slice may only include model elements that are active during the particular period of time and, when executed, may exhibit the same behavior exhibited by the model during the particular period of time. As shown in FIG. 20, the modeling environment 700 and/or the TCE provides, for display, the model slice along with a result of executing the model slice. The model slice exhibits the same behavior as the model during the particular period of time.

In some embodiments, the model analyzer 712 may analyze a model slice, and identify final destination model elements and/or final source model elements of the model slice from a starting location on a given path of the model slice. For example, the path marking unit 714 may treat the boundaries of a model slice as final sources and final destinations for purposes of highlighting a path. Model elements and connection elements that are outside of the model slice may be regarded by the path marking unit 714 as being disconnected from the model slice. The path marking unit 714 may highlight on a visual presentation of the model or the model slice, a path from the starting location to one or more final destination model elements and/or one or more final source model elements of the model slice. In addition, the path marking unit 714 may incrementally trace a path through the model slice in a model-element-by-model-element manner to final sources and/or final destinations within the model slice. For example, the path marking unit 714 may trace the path through the model slice in a step-wise manner from a starting location to one or more final destination model elements and/or one or more final source model elements of the model slice.

In some implementations, the path marking unit 714 may define a model slice by tracing the paths from a starting location, such as a given signal of a model, to the final sources and/or final destinations relative to that starting location. The path marking unit 714 may include the model elements and the connection elements disposed along the paths from the starting location to the final sources and/or final destinations in a model slice. The model editor 704 may generate a visual presentation of the model slice as defined by the path marking unit 714, for example separately from the model, on a display.

Critical Path Evaluation

In some embodiments, the critical path of a model or a portion thereof may be determined. The critical path may be the path through the model that has the longest overall latency, if the model's functionality were to be implemented in hardware, such as a programmable logic device. For example, latencies may be associated with the model elements of a model. These latencies may be summed along the various paths of the model, and the path with the longest, e.g., highest, latency may be identified as the critical path of the model.

In some embodiments, the IR builder 724 may receive a model and create one or more intermediate representations (IRs) for the model. For example, the IR builder 724 may create a Control Flow Graph (CFG). The CFG may include a plurality of nodes that represent the operations of the model. That is, each model element, e.g., block, of the model may map to one or more nodes of the CFG. The nodes of the CFG may be interconnected by arcs that represent the control dependencies among the nodes. The IR builder 724 may then overlay a data flow representation onto the CFG so as to create a Control Data Flow Graph (CDFG).

The CDFG may capture the control flow as well as the data flow of a model through its data dependency and the control dependency edges, respectively.

The CDFG may be utilized by the code generator 706 to generate code from the model. The generated code may be in the form of a Hardware Description Language (HDL), which may be exported to a hardware synthesis and layout tool. The hardware synthesis and layout tool may convert the HDL code into a serial bit stream for synthesizing target hardware, such as a Field Programmable Gate Array (FPGA), or some other programmable logic device.

Suitable synthesis and layout tools include the ModelSim simulation and debug environment from Mentor Graphics Corp of Wilsonville, OR, and the Synplify family of synthesis tools from Synplicity, Inc. of Sunnyvale, CA.

One or more nodes of a CDFG may have an associated latency that corresponds to the execution time of the respective node. The latencies of the nodes of the CDFG may be stored in one or more data structures together with other information regarding the nodes, such as the operation performed by the node, pointers to the node's child and/or parent node(s), etc. The latencies may be obtained from the hardware synthesis and layout tool, and may vary depending on the particular model or vendor of the particular programmable logic device being utilized. The code generator 706 may use latencies corresponding to a particular programmable logic device, or it may use assumed latencies, which may be obtained by averaging the latencies associated with some number of different programmable logic devices.

The code generator 706 may include a critical path detection engine that may evaluate a CDFG, and compute the critical path using the CDFG. The critical path is the path through the CDFG that has the longest overall latency. To compute the critical path, the critical path detection engine may traverse each path of the CDFG and sum the latencies of the operations on each path. The path having the highest sum may be deemed the critical path. The critical path detection engine may highlight or otherwise mark the critical path on a display of the model.

In some embodiments, the critical path of a model or portion thereof may be determined. The model analyzer 712 may analyze the model, and identify final destination model elements and/or final source model elements along the critical path from a starting location on the critical path. The path marking unit 714 may highlight on a visual presentation of the model, a portion of the critical path from the starting location to one or more final destination model elements and/or one or more final source model elements. In addition, the path marking unit 714 may incrementally trace the critical path of the model in a model-element-by-model-element manner. For example, the path marking unit 714 may trace the critical path through the model in a step-wise manner from a starting location to one or more final destination model elements and/or one or more final source model elements along the critical path.

In some embodiments, the path marking unit 714 may highlight from a starting location, such as a signal of a model, to the critical path of the model. That is, the path marking unit 714 may consider the model elements along the critical path to be final source model elements or final destination model elements.

Illustrative Data Processing System

Figure 17:
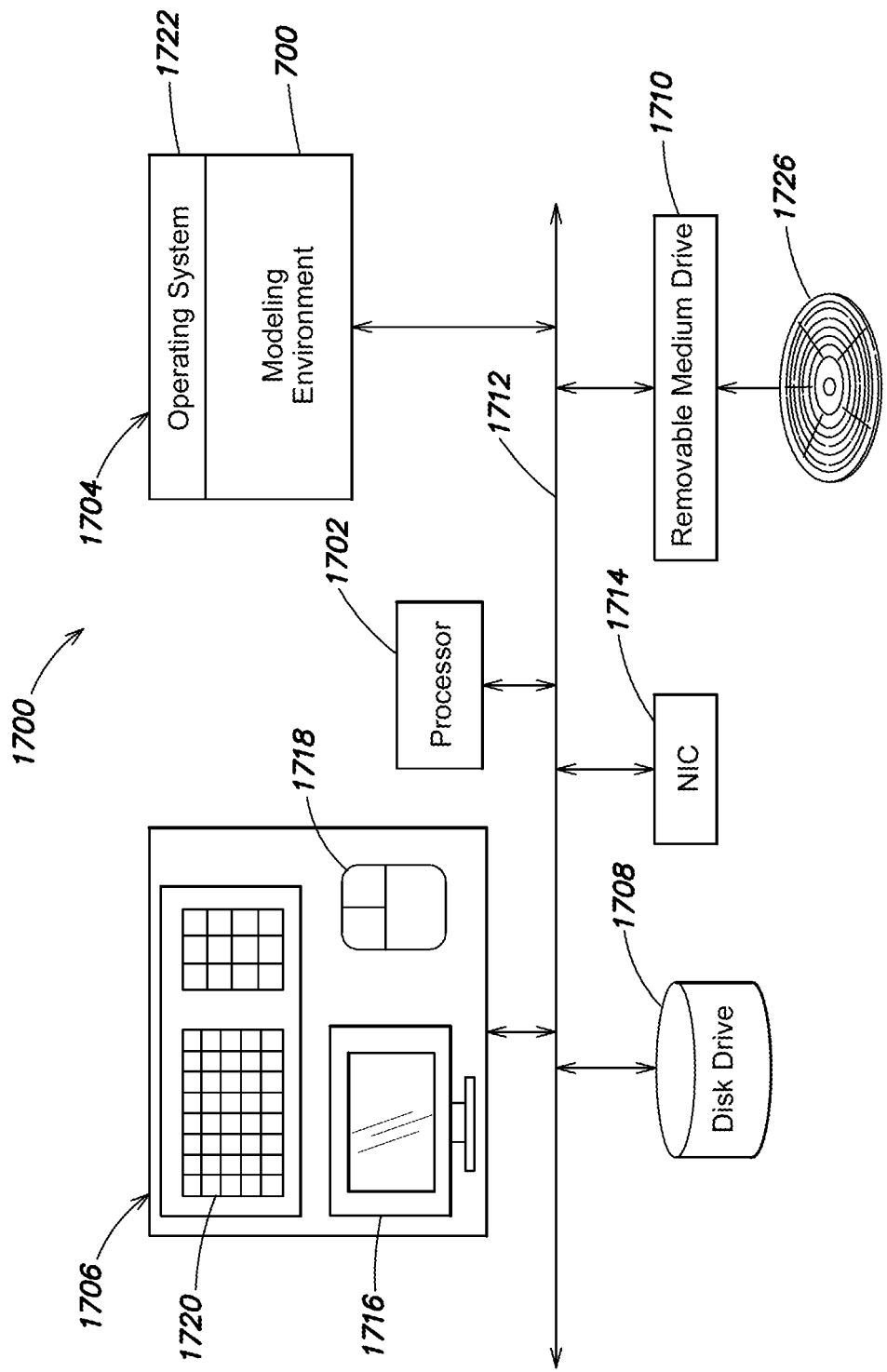
FIG. 17 is a schematic illustration of a computer or data processing system in accordance with an embodiment.

FIG. 17 is a schematic illustration of a computer or data processing system 1700 for implementing an embodiment of the invention. The computer system 1700 may include one or more processing elements, such as a processor 1702, a main memory 1704, user input/output (I/O) 1706, a persistent data storage unit, such as a disk drive 1708, and a removable medium drive 1710 that are interconnected by a system bus 1712. The computer system 1700 may also include a communication unit, such as a network interface card (NIC) 1714. The user I/O 1706 may include a keyboard 1720, a pointing device, such as a mouse 1718, and a display 1716. Other user I/O 1706 components include voice or speech command systems, touchpads and touchscreens, printers, projectors, etc. Exemplary processors include single or multi-core Central Processing Units (CPUs), Graphics Processing Units (GPUs), Field Programmable Gate Arrays (FPGAs), Application Specific Integrated Circuits (ASICs), microprocessors, microcontrollers, etc.

The main memory 1704, which may be a Random Access Memory (RAM), may store a plurality of program libraries or modules, such as an operating system 1722, and one or more application programs that interface to the operating system 1722, such as the modeling environment 700.

The removable medium drive 1710 may accept and read a computer readable medium 1726, such as a CD, DVD, floppy disk, solid state drive, tape, flash memory or other non-transitory medium. The removable medium drive 1710 may also write to the computer readable medium 1726.

Suitable computer systems include personal computers (PCs), workstations, servers, laptops, tablets, palm computers, smart phones, electronic readers, and other portable computing devices, etc. Nonetheless, those skilled in the art will understand that the computer system 1700 of FIG. 17 is intended for illustrative purposes only, and that the present invention may be used with other computer, data processing, or computational systems or devices. The present invention may also be used in a computer network, e.g., client-server, architecture, or a public and/or private cloud computing arrangement. For example, the modeling environment 700 may be hosted on one or more cloud servers or devices, and accessed by remote clients through a web portal or an application hosting system, such as the Remote Desktop Connection tool from Microsoft Corp.

Suitable operating systems 1722 include the Windows series of operating systems from Microsoft Corp. of Redmond, WA, the Android and Chrome OS operating systems from Google Inc. of Mountain View, CA, the Linux operating system, the MAC OS® series of operating systems from Apple Inc. of Cupertino, CA, and the UNIX® series of operating systems, among others. The operating system 1722 may provide services or functions for applications or modules, such as allocating memory, organizing data objects or files according to a file system, prioritizing requests, managing I/O, etc. The operating system 1722 may run on a virtual machine, which may be provided by the data processing system 1700.

As indicated above, a user, such as an engineer, scientist, programmer, developer, etc., may utilize one or more input devices, such as the keyboard 1720, the mouse 1718, and the display 1716 to operate the modeling environment 700, and construct and revise one or more models. As discussed, the models may be computational and may have executable semantics. In particular, the models may be simulated or run. In particular, the models may provide one or more of time-based, event-based, state-based, message-based, frequency-based, control-flow based, and dataflow-based execution semantics. The execution of a model may simulate operation of the system that is being designed or evaluated. The term graphical model is intended to include graphical program.

Figure 18:
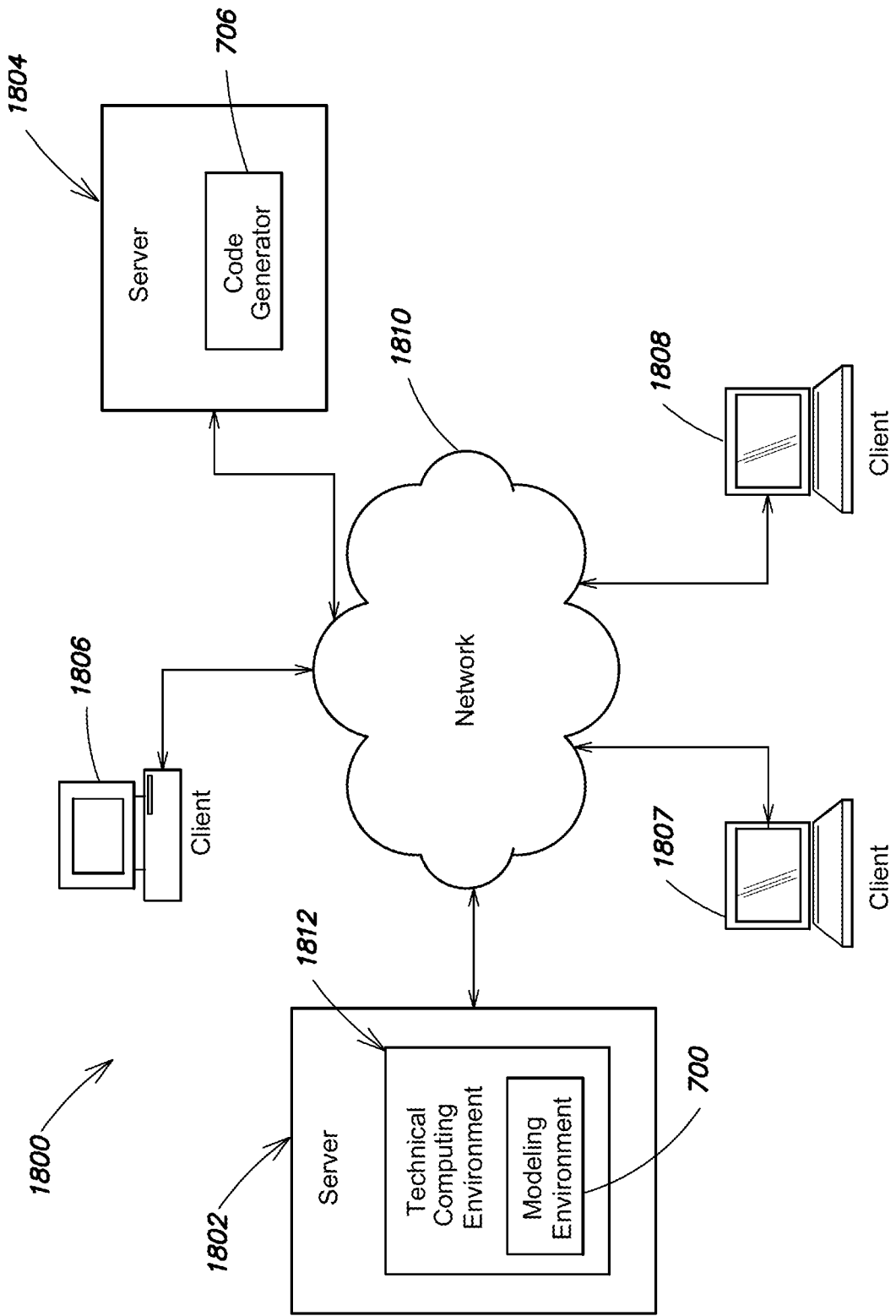
FIG. 18 is a schematic diagram of an example distributed computing environment in accordance with an embodiment.

FIG. 18 is a schematic diagram of an example distributed computing environment 1800 in which systems and/or methods described herein may be implemented. The environment 1800 may include client and server devices, such as two servers 1802 and 1804, and three clients 1806-1808, interconnected by one or more networks, such as network 1810. The servers 1802 and 1804 may include applications or processes accessible by the clients 1806-1808. For example, the server 1802 may include a technical computing environment (TCE) 1812, which may include or have access to a modeling environment, such as the modeling environment 700. The server 1804 may include a code generator, such as the code generator 706. The devices of the environment 1800 may interconnect via wired connections, wireless connections, or a combination of wired and wireless connections.

The servers 1802 and 1804 may include one or more devices capable of receiving, generating, storing, processing, executing, and/or providing information. For example, the servers 1802 and 1804 may include a computing device, such as a server, a desktop computer, a laptop computer, a tablet computer, a handheld computer, or a similar device. In some implementations, the servers 1802 and 1804 may host the TCE 1812, the modeling environment 700, and/or the code generator 706.

The clients 1806-1808 may be capable of receiving, generating, storing, processing, executing, and/or providing information. Information may include any type of machine-readable information having substantially any format that may be adapted for use, e.g., in one or more networks and/or with one or more devices. The information may include digital information and/or analog information. The information may further be packetized and/or non-packetized. In an embodiment, the clients 1806-1808 may download data and/or code from the servers 1802 and 1804 via the network 1810. In some implementations, the clients 1806-1808 may be desktop computers, workstations, laptop computers, tablet computers, handheld computers, mobile phones (e.g., smart phones, radiotelephones, etc.), electronic readers, or similar devices. In some implementations, the clients 1806-1808 may receive information from and/or transmit information to the servers 1802 and 1804.

The network 1810 may include one or more wired and/or wireless networks. For example, the network 1810 may include a cellular network, a public land mobile network (PLMN), a local area network (LAN), a wide area network (WAN), a metropolitan area network (MAN), a telephone network (e.g., the Public Switched Telephone Network (PSTN)), an ad hoc network, an intranet, the Internet, a fiber optic-based network, and/or a combination of these or other types of networks. Information may be exchanged between network devices using any network protocol, such as, but not limited to, the Internet Protocol (IP), Asynchronous Transfer Mode (ATM), Synchronous Optical Network (SONET), the User Datagram Protocol (UDP), Institute of Electrical and Electronics Engineers (IEEE) 802.11, etc.

The number of devices and/or networks shown in FIG. 18 is provided as an example. In practice, there may be additional devices and/or networks, fewer devices and/or networks, different devices and/or networks, or differently arranged devices and/or networks than those shown in FIG. 18. Furthermore, two or more devices shown in FIG. 18 may be implemented within a single device, or a single device shown in FIG. 18 may be implemented as multiple, distributed devices. Additionally, one or more of the devices of the environment 1800 may perform one or more functions described as being performed by another one or more devices of the environment 1800.

The foregoing description of embodiments is intended to provide illustration and description, but is not intended to be exhaustive or to limit the disclosure to the precise form disclosed. Modifications and variations are possible in light of the above teachings or may be acquired from a practice of the disclosure. For example, while a series of acts has been described above with respect to the flow diagrams, the order of the acts may be modified in other implementations. In addition, the acts, operations, and steps may be performed by additional or other modules or entities, which may be combined or separated to form other modules or entities. Further, non-dependent acts may be performed in parallel. Also, the term "user", as used herein, is intended to be broadly interpreted to include, for example, a computer or data processing system or a human user of a computer or data processing system, unless otherwise stated.

Further, certain embodiments of the disclosure may be implemented as logic that performs one or more functions. This logic may be hardware-based, software-based, or a combination of hardware-based and software-based. Some or all of the logic may be stored in one or more tangible non-transitory computer-readable storage media and may include computer-executable instructions that may be executed by a computer or data processing system, such as system 1700. The computer-executable instructions may include instructions that implement one or more embodiments of the disclosure. The tangible non-transitory computer-readable storage media may be volatile or non-volatile and may include, for example, flash memories, dynamic memories, removable disks, and non-removable disks.

No element, act, or instruction used herein should be construed as critical or essential to the disclosure unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

The foregoing description has been directed to specific embodiments of the present disclosure. It will be apparent, however, that other variations and modifications may be made to the described embodiments, with the attainment of some or all of their advantages. Therefore, it is the object of the appended claims to cover all such variations and modifications as come within the true spirit and scope of the disclosure.

What is claimed is:

1. A method comprising:
for an executable model including:
a plurality of model elements interconnected by connection elements, where the plurality of model elements:
i. are arranged along a plurality of paths through the executable model; and
ii. perform one or more operations, functions, or procedures during execution of the executable model, the executable model executable in a modeling environment to simulate a system;
analyzing the executable model to at least one of (1) determine an execution schedule of selected model elements along a path from a starting location within the executable model or (2) construct a model structure for the executable model that indicates at least one of data dependencies or control dependencies among the plurality of model elements of the executable model;
identifying, utilizing the at least one of the determined execution schedule or the constructed model structure, selected model elements of the plurality of model elements as
a plurality of final destination model elements from the starting location within the executable model, or
a plurality of final source model elements from the starting location,
wherein the executable model executes over a plurality of simulation time steps, and wherein when the identifying is performed utilizing the determined execution schedule, the plurality of final destination model elements or plurality of final source model elements execute in a same simulation time step, of the plurality of simulation time steps, that is determined based on the execution schedule; and
after the identifying, tracing with highlighting one or more, but not all, of the plurality of model elements, on a visual presentation of at least a portion of the executable model, along one or more first paths of the plurality of paths that lead from the starting location to
the plurality of final destination model elements, or
the plurality of final source model elements,
the highlighting implemented through one or more graphical affordances.

2. The method of claim 1 wherein the tracing is performed in a model-element-by-model-element manner.

3. The method of claim 2 further comprising:
utilizing a breadth first search (BFS), a depth first search (DFS), or a combination of BFS and DFS to identify a next model element being traced on the one or more first paths.

4. The method of claim 3 where the BFS or the DFS is utilized in response to user input.

5. The method of claim 1 wherein the executable model includes a plurality of hierarchical levels, and the starting location is at a given one of the plurality of hierarchical levels, the method further comprising:
stepping down the plurality of hierarchical levels to a lower hierarchical level from the given one of the plurality of hierarchical levels; and
highlighting a portion of the one or more first paths through the lower hierarchical level.

6. The method of claim 1 wherein the executable model includes a plurality of hierarchical levels, and the starting location is at a given one of the plurality of hierarchical levels, the method further comprising:
stepping up the plurality of hierarchical levels to a higher hierarchical level from the given one of the plurality of hierarchical levels; and
highlighting a portion of the one or more first paths through the higher hierarchical level.

7. The method of claim 1 wherein the plurality of final destination model elements:
have no output ports,
have no connected output ports,
are connected to downstream model elements that are commented out,
represent a boundary between two different modeling domains,
are non-direct-feedthrough model elements, or
are specified as a final destination model element.

8. The method of claim 1 wherein the plurality of final source model elements:
have no input ports,
have no connected input ports,
are connected to upstream model elements that are commented out,
represent a boundary between two different modeling domains,
are non-direct-feedthrough model elements, or
are specified as a final source model element.

9. The method of claim 1 further comprising fast-forward highlighting from a current location in the executable model to the plurality of final destination model elements, or to the plurality of final source model elements.

10. The method of claim 9 wherein
the one or more first paths that lead to the plurality of final destination model elements are highlighted with different ones of the one or more graphical affordances, or
the one or more first paths that lead to the plurality of final source model elements are highlighted with different ones of the one or more graphical affordances.

11. The method of claim 10 further comprising:
providing a legend window with the visual presentation of the at least a portion of the executable model wherein the legend window identifies
the different ones of the one or more graphical affordances implemented to highlight the one or more first paths that lead to the plurality of final destination model elements, or
the different ones of the one or more graphical affordances implemented to highlight the one or more first paths that lead to the plurality of final source model elements.

12. The method of claim 1 wherein at least a portion of the plurality of model elements constitute a model slice generated for the executable model.

13. The method of claim 1 wherein the given path at least partially overlaps a critical path of the executable model.

14. The method of claim 1 wherein the executable model implements one or more of time-based, event-based, state-based, message-based, frequency-based, control-flow based, or dataflow-based execution semantics.

15. The method of claim 1 further comprising:
starting an execution of the executable model;
pausing the execution of the executable model; and
displaying a data value output by a first model element of the plurality of model elements, while the execution of the executable model is paused.

16. One or more non-transitory computer-readable media, having stored thereon instructions that when executed by one or more computing devices, cause the one or more computing devices to perform operations comprising:
for an executable model including:
a plurality of model elements interconnected by connection elements, where the plurality of model elements:
i. are arranged along a plurality of paths through the executable model; and
ii. perform one or more operations, functions, or procedures during execution of the executable model, the executable model executable in a modeling environment to simulate a system;
analyzing the executable model to at least one of (1) determine an execution schedule of selected model elements along a path from a starting location within the executable model or (2) construct a model structure for the executable model that indicates at least one of data dependencies or control dependencies among the plurality of model elements of the executable model;
identifying, utilizing the at least one of the determined execution schedule or the constructed model structure, selected model elements of the plurality of model elements as
a plurality of final destination model elements from the starting location within the executable model, or
a plurality of final source model elements from the starting location,
wherein the executable model executes over a plurality of simulation time steps, and wherein when the identifying is performed utilizing the determined execution schedule, the plurality of final destination model elements or the of plurality final source model elements execute in a same simulation time step, of the plurality of simulation time steps, that is determined based on the execution schedule; and
after the identifying, tracing with highlighting one or more, but not all, of the plurality of model elements, on a visual presentation of at least a portion of the executable model, along one or more first paths of the plurality of paths that lead from the starting location to
the plurality of final destination model elements, or
to the plurality of final source model elements, the highlighting implemented through one or more graphical affordances.

17. The one or more non-transitory computer-readable media of claim 16 wherein the tracing is performed in a model-element-by-model-element manner.

18. The one or more non-transitory computer-readable media of claim 16 wherein the executable model includes a plurality of hierarchical levels, and the starting location is at a given one of the plurality of hierarchical levels, the operations further comprise:
stepping down the plurality of hierarchical levels to a lower hierarchical level from the given one of the plurality of hierarchical levels; and
highlighting a portion of the one or more first paths through the lower hierarchical level.

19. The one or more non-transitory computer-readable media of claim 16 wherein the executable model includes a plurality of hierarchical levels, and the starting location is at a given one of the plurality of hierarchical levels, the method further comprising:
stepping up the plurality of hierarchical levels to a higher hierarchical level from the given one of the plurality of hierarchical levels; and
highlighting a portion of the one or more first paths through the higher hierarchical level.

20. The one or more non-transitory computer-readable media of claim 16 further comprising instructions to fast-forward highlighting from a current location in the executable model to the plurality of final destination model elements, or to the plurality of final source model elements.

21. The one or more non-transitory computer-readable media of claim 20 wherein
the one or more first paths that lead to the plurality of final destination model elements are highlighted with different ones of the one or more graphical affordances, or
the one or more first paths that lead to the plurality of final source model elements are highlighted with different ones of the one or more graphical affordances.

22. The one or more non-transitory computer-readable media of claim 21 further comprising instructions to:
provide a legend window with the visual presentation of the at least a portion of the executable model wherein the legend window identifies
the different ones of the one or more graphical affordances implemented to highlight the one or more first paths that lead to the plurality of final destination model elements, or
the different ones of the one or more graphical affordances implemented to highlight the one or more first paths that lead to the plurality of final source model elements.

23. An apparatus comprising:
a memory storing an executable model including:
- a plurality of model elements interconnected by connection elements, where the plurality of model elements:
  i. are arranged along a plurality of paths through the executable model; and
  ii. perform one or more operations, functions, or procedures during execution of the executable model, the executable model executable in a modeling environment to simulate a system;

a display; and
a processor coupled to the memory and the display, the processor configured to
- analyze the executable model to at least one of (1) determine an execution schedule of selected model elements along a path from a starting location within the executable model or (2) construct a model structure for the executable model that indicates at least one of data dependencies or control dependencies among the plurality of model elements of the executable model;
- identify, utilizing the at least one of the determined execution schedule or the constructed model structure, selected model elements of the plurality of model elements as
  a plurality of final destination model elements from the starting location within the model, or
  a plurality of final source model elements from the starting location,
    wherein the executable model executes over a plurality of simulation time steps, and wherein when the identifying is performed utilizing the determined execution schedule, the plurality of final destination model elements or the plurality of final source model elements execute in a same simulation time step, of the plurality of simulation time steps, that is determined based on the execution schedule; and
- after the identify, trace with highlighting one or more, but not all, of the plurality of model elements, on a visual presentation of at least a portion of the executable model presented on the display, along one or more first paths of the plurality of paths that lead from the starting location to
  the plurality of final destination model elements, or
  to the plurality of final source model elements,
    the highlighting implemented through one or more graphical affordances.

24. The apparatus of claim 23 wherein the executable model includes a plurality of hierarchical levels, and the starting location is at a given one of the plurality of hierarchical levels, the processor further configured to:
step down the plurality of hierarchical levels to a lower hierarchical level from the given one of the plurality of hierarchical levels; and
highlight a portion of the one or more first paths through the lower hierarchical level.

25. The apparatus of claim 23 wherein the executable model includes a plurality of hierarchical levels, and the starting location is at a given one of the plurality of hierarchical levels, the processor further configured to:
step up the plurality of hierarchical levels to a higher hierarchical level from the given one of the plurality of hierarchical levels; and
highlight a portion of the one or more first paths through the higher hierarchical level.

26. The apparatus of claim 23 wherein the processor is further configured to fast-forward highlighting from a current location in the executable model to the plurality of final destination model elements, or to the plurality of final source model elements.

27. The apparatus of claim 26 wherein
the one or more first paths that lead to the plurality of final destination model elements are highlighted with different ones of the one or more graphical affordances, or
the one or more first paths that lead to the plurality of final source model elements are highlighted with different ones of the one or more graphical affordances.

28. The apparatus of claim 27 wherein the processor is further configured to:
provide a legend window with the visual presentation of the at least a portion of the executable model wherein the legend window identifies the different ones of the one or more graphical affordances implemented to highlight the one or more first paths that lead to the plurality of final destination model elements, or
the different ones of the one or more graphical affordances implemented to highlight the one or more first paths that lead to the plurality of final source model elements.

* * * * *

UNITED STATES PATENT AND TRADEMARK OFFICE
CERTIFICATE OF CORRECTION

| | | |
|---|---|---|
| PATENT NO. | : 11,853,690 B1 | Page 1 of 1 |
| APPLICATION NO. | : 15/420544 | |
| DATED | : December 26, 2023 | |
| INVENTOR(S) | : Fu Zhang et al. | |

It is certified that error appears in the above-identified patent and that said Letters Patent is hereby corrected as shown below:

In the Specification

Column 15, Line 33:
"subchart, an AND substrate, an OR substrate, a referenced"
Should read:
--subchart, an AND substate, an OR substate, a referenced--

Column 16, Line 40:
"subchart, an AND substrate, an OR substrate, a masked"
Should read:
--subchart, an AND substate, an OR substate, a masked--

Signed and Sealed this
Fourteenth Day of October, 2025

John A. Squires
*Director of the United States Patent and Trademark Office*